(12) United States Patent
Ohmi et al.

(10) Patent No.: US 7,663,195 B2
(45) Date of Patent: Feb. 16, 2010

(54) P-CHANNEL POWER MIS FIELD EFFECT TRANSISTOR AND SWITCHING CIRCUIT

(75) Inventors: Tadahiro Ohmi, 1-17-301, Komegafukuro 2-chome, Aoba-ku, Sendai-shi, Miyagi 980-0813 (JP); Akinobu Teramoto, Miyagi (JP); Hiroshi Akahori, Kanagawa (JP); Keiichi Nii, Miyagi (JP); Takanori Watanabe, Shizuoka (JP)

(73) Assignees: Tadahiro Ohmi, Miyagi (JP); Yazaki Corporation, Tokyo (JP)

(*) Notice: Subject to any disclaimer, the term of this patent is extended or adjusted under 35 U.S.C. 154(b) by 0 days.

(21) Appl. No.: 11/285,772

(22) Filed: Nov. 22, 2005

(65) Prior Publication Data

US 2006/0138538 A1    Jun. 29, 2006

Related U.S. Application Data

(63) Continuation of application No. PCT/JP2004/007075, filed on May 24, 2004.

(30) Foreign Application Priority Data

May 26, 2003   (JP) ............................... 2003-148275

(51) Int. Cl.
   *H01L 29/76* (2006.01)
(52) U.S. Cl. .................. 257/409; 257/410; 257/628; 257/E29.132
(58) Field of Classification Search ........ 257/409–411, 257/627, 628, E29.132, E29.162
See application file for complete search history.

(56) References Cited

U.S. PATENT DOCUMENTS

| 6,357,385 | B1 | 3/2002 | Ohmi et al. |
| 6,483,156 | B1 * | 11/2002 | Adkisson et al. ............ 257/401 |
| 6,551,948 | B2 * | 4/2003 | Ohmi et al. ................. 438/778 |
| 6,720,632 | B2 * | 4/2004 | Noda ......................... 257/408 |
| 6,903,393 | B2 | 6/2005 | Ohmi et al. |
| 2002/0072158 | A1 * | 6/2002 | Tanabe et al. ............... 438/164 |
| 2004/0032003 | A1 | 2/2004 | Ohmi et al. |

FOREIGN PATENT DOCUMENTS

| JP | 04372166 A2 | 12/1992 |
| JP | 07231088 A2 | 8/1995 |
| JP | 09010713 A2 | 1/1997 |

(Continued)

OTHER PUBLICATIONS

Miyashita, M., et al., "Dependence of Surface Microroughness of CZ, FZ and EPI Wafers on Wet Chemical Processing", *J. Electrochem. Soc.*, vol. 139, No. 8, (Aug. 1992), 2133-2142.

(Continued)

*Primary Examiner*—Matthew E Warren
(74) *Attorney, Agent, or Firm*—Schwegman, Lundberg & Woessner, P.A.

(57) ABSTRACT

In a P-channel power MIS field effect transistor formed on a silicon surface having substantially a (110) plane, a gate insulation film is used which provides a gate-to-source breakdown voltage of 10 V or more, and planarizes the silicon surface, or contains Kr, Ar, or Xe.

17 Claims, 15 Drawing Sheets

FOREIGN PATENT DOCUMENTS

| | | |
|---|---|---|
| JP | 11057636 A2 | 3/1999 |
| JP | 11307497 A2 | 11/1999 |
| JP | 2000-150792 | 5/2000 |
| JP | 2003115587 A2 | 4/2003 |
| JP | 2004200672 A2 | 7/2004 |
| WO | WO-9833362 A1 | 7/1998 |
| WO | WO-03/32399 A1 | 4/2003 |

OTHER PUBLICATIONS

Nagamine, Makoto, et al., "Radical Oxygen (O*) Process for Highly-Reliable SiO2 with Higher Film-Density and Smoother SiO2/Si Interface", *International Electron Devices Meeting Technical Digest*, (1998), 593-596.

Sato, Tai, et al., "Mobility Anisotrophy of Electrons in Inversion Layers on Oxidized Silicon Surfaces", *Physical Review B*, vol. 4, No. 6, (Sep. 15, 1972), 1950-1960.

Sato, Karzuo, et al., "Roughening of single-crystal silicon surface etched by KOH water solution", *Sensors and Actuators*, vol. 73, (1999), 122-130.

Throngnumchai, K., "Ultralow On-Resistance P-Channel Lateral DMOS Fabricated on (110)-Oriented Si Substrate", *IEEE Transactions on Electron Devices*, vol. 40, No. 11, (Nov. 1993), 2132-2133.

European Patent Application No. 04745284, Communication and European Search Report mailed Jun. 12, 2008, 7 pgs.

Hirayama, M., et al., "Low Temperature Growth of High Integrity Silicon Oxide Films by Oxygen Radical Generated in High Density Krypton Plasma", *Electron Devices Meeting*, 1999, 249-252.

Ohtsubo, K., et al., "Low Temperature Growth(400° C.) of High Integrity Thin Silicon-Oxynitride Films by Microwave-Excited High-Density Kr/$O_2$/$NH_3$ Plasma", *Proceedings, 22nd Convention of Electrical and Electronic Engineers in Israel*, (Piscataway, NJ), (2002), 166-169.

Saito, Y., et al., "A Study of Direct Oxidation and Oxynitridation of Silicon Surface by Using Radical Generated in Microwave-Excited High-Density Plasma", *Record of Electrical and Communication Engineering Conservazione*, 71(1), (2002),105-108.

Tsukuda, T., et al., "Low Temperature Growth of Si Oxide with Good Electrical Qualities Using Helicon-Wave-Excited $O_2$- Ar Plasma and Forming gas Annealing", *Japanese Journal of Applied Physics*, 39(1), (2000), 8-13.

* cited by examiner

Dry gate oxide

O* gate oxide

FIG.5A STI FORMATION
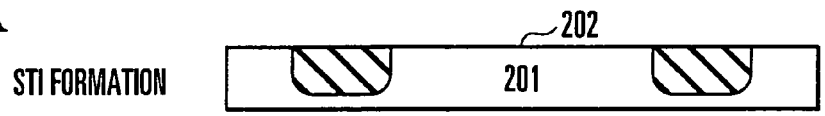
FIG.5B RCA CLEANING
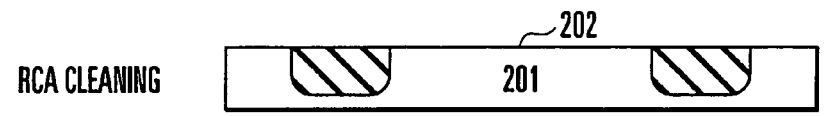
FIG.5C GATE INSULATION FILM FORMATION
FIG.5D ION IMPLANTATION
FIG.5E GATE ELECTRODE FORMATION
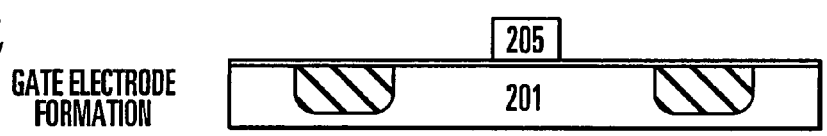
FIG.5F ION IMPLANTATION
FIG.5G SIDEWALL INSULATION FILM FORMATION
FIG.5H ION IMPLANTATION
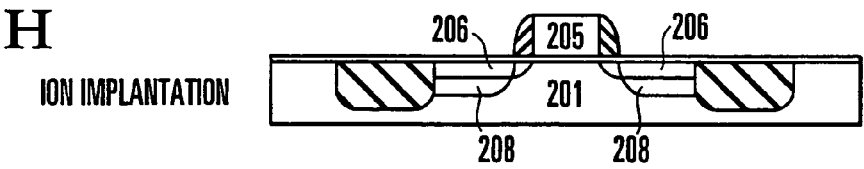

FIG.11A STI FORMATION
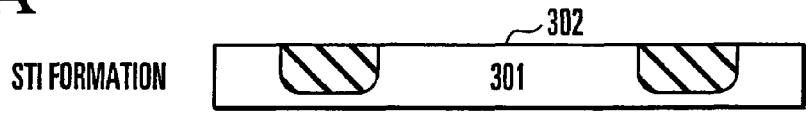
FIG.11B IMPROVED RCA CLEANING
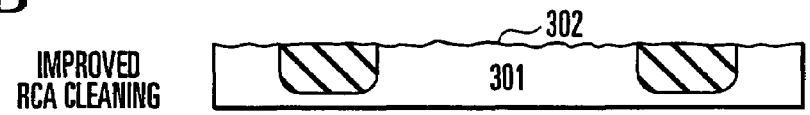
FIG.11C PLANARIZING OXIDATION
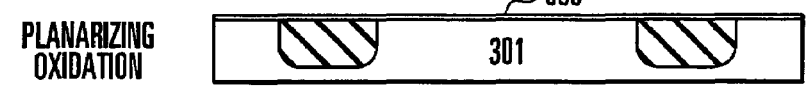
FIG.11D OXIDE FILM PEELING
FIG.11E GATE INSULATION FILM FORMATION
FIG.11F ION IMPLANTATION
FIG.11G GATE ELECTRODE FORMATION
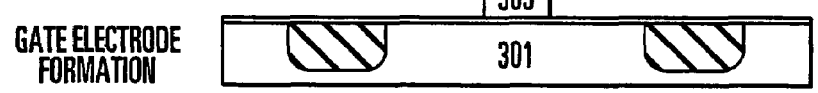
FIG.11H ION IMPLANTATION
FIG.11I SIDEWALL INSULATION FILM FORMATION
FIG.11J ION IMPLANTATION

FIG.14A STI FORMATION 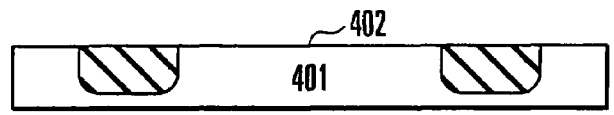
FIG.14B IMPROVED RCA CLEANING 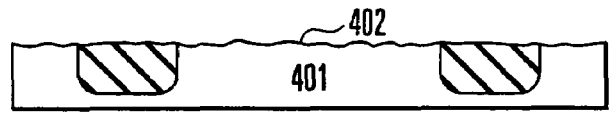
FIG.14C PLANARIZING OXIDATION 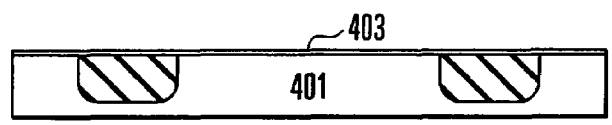
FIG.14D OXIDE FILM PEELING 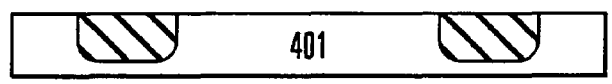
FIG.14E GATE INSULATION FILM FORMATION 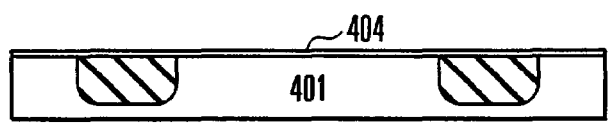
FIG.14F ION IMPLANTATION 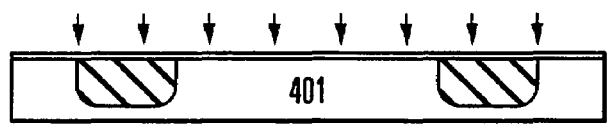
FIG.14G GATE ELECTRODE FORMATION 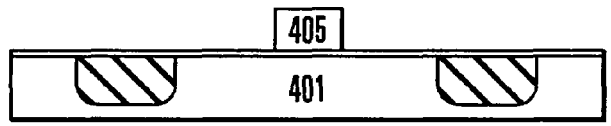
FIG.14H ION IMPLANTATION 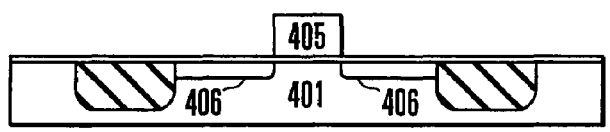
FIG.14I SIDEWALL INSULATION FILM FORMATION 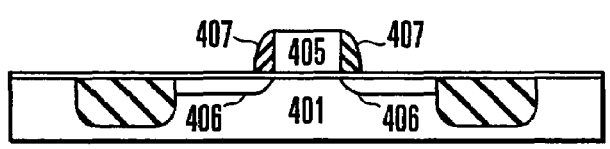
FIG.14J ION IMPLANTATION 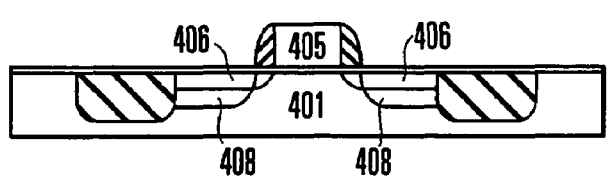

P-CHANNEL POWER MIS FIELD EFFECT TRANSISTOR AND SWITCHING CIRCUIT

RELATED APPLICATIONS

This application is a continuation under 35 U.S.C. 111(a) of PCT/JP2004/007075, filed May 24, 2004, and published on Dec. 2, 2004 as WO 2004/105116 A1, which claimed priority to Japanese Application No. 148275/2003, filed May 26, 2003, which applications and publication are incorporated herein by reference.

TECHNICAL FIELD

The present invention relates to a P-channel power MIS field effect transistor, and more particularly to a P-channel power MIS field effect transistor by which performance equal to or higher than that of an N-channel power MIS field effect transistor can be obtained for the same size and the same cost, and a switching circuit using this P-channel power MIS field effect transistor.

BACKGROUND ART

To move and stop automobile electronic parts such as wipers and door locks, switching circuits which turn on/off voltage supply from batteries to loads such as motors are used. Although relays are conventionally used as these switching circuits, the use of semiconductor devices is being demanded for the purposes of downsizing and power saving. Examples of loads as objects of switching control by semiconductor devices are the wiper motor and door lock motor described above, and a blower motor, a power seat motor, lamps such as a head lamp and tail lamp, a horn, a rear defogger, and a seat heater. The driving current is a few A to about 20 A, the battery rated voltage is 12 or 36 V, and the breakdown voltage is 60 to 100 V. Recently, semiconductor devices adaptable to large electric currents and high voltages of electrical automobiles such as HEV and FCV are also being required.

FIG. 21 is a circuit diagram showing an example of the conventional switching circuit using a semiconductor device. The switching circuit shown in FIG. 21 includes a charge pump circuit CP101, resistors R101 and R102, and an N-channel power MOS field effect transistor Q101 formed on a (100) plane of a silicon substrate. A power supply voltage BATT (a battery rated voltage) is 12 or 36 V. To turn on this switching circuit, a microcomputer MC outputs a high-level voltage (the battery voltage BATT). In this state, the source voltage of the transistor Q101 becomes lower than its gate voltage by the amount of a threshold voltage, so a voltage to be supplied to a load LO decreases by the threshold voltage of the transistor Q101 if the output of the microcomputer MC is directly connected to the resistors R101 and R102. Therefore, this voltage drop is avoided by raising the output of the microcomputer MC by the charge pump circuit CP101. However, the switching circuit shown in FIG. 21 has the problems that the cost rises by the cost of the charge pump circuit CP101, and the charge pump circuit CP101 radiates noise.

FIG. 22 is a circuit diagram showing another example of the conventional switching circuit. In the arrangement shown in FIG. 21, the N-channel power MOS field effect transistor Q101 as a switching element is inserted in the high-potential side of a power supply line to the load LO. On the other hand, the switching circuit shown in FIG. 22 takes a bridge configuration in which N-channel power MOS field effect transistors Q111 and Q112 are inserted in the high-potential side of a power supply line, and N-channel power MOS field effect transistors Q113 and Q114 are inserted in the low-potential side (ground) of the power supply line. This switching circuit includes the transistors Q111, Q112, Q113, and Q114, resistors R111, R112, R113, and R114, a high-side drive circuit DR1, and a low-side drive circuit DR2. The high-side drive circuit DR1 includes a bipolar transistor and the like which drive the transistors Q111 and Q112 by amplifying the output electric current from a microcomputer MC. Likewise, the low-side drive circuit DR2 includes a bipolar transistor and the like which drive the transistors Q113 and Q114. As in the arrangement shown in FIG. 21, the switching circuit shown in FIG. 22 also requires a charge pump circuit CP101 in order to avoid the load voltage drop, and therefore has the problems that the cost rises by the cost of the charge pump circuit CP101, and the charge pump circuit CP101 radiates noise.

Another method of avoiding the load voltage drop is to use a P-channel power MOS field effect transistor. Since the P-channel power MOS field effect transistor causes no such voltage drop as explained for the N-channel power MOS field effect transistor, a switching circuit can be implemented without using any charge pump circuit, so the above-mentioned problems related to the charge pump circuit can be eliminated.

Unfortunately, the current drivability, e.g., the mobility, of a P-channel MOS field effect transistor formed on a (100) plane of silicon like an N-channel MOS transistor, is about ⅓ that of the N-channel MOS field effect transistor, so the size of the P-channel MOS transistor must be made about three times as large as the N-channel MOS transistor in order to obtain current drivability equal to that of the N-channel MOS transistor by the P-channel MOS transistor. Accordingly, when a P-channel MOS transistor having characteristics equal to an N-channel MOS transistor is formed on a (100) plane of silicon, the cost is about three times that of the N-channel MOS transistor, and this poses the problem that the cost of the whole switching circuit becomes higher than those of the circuits shown in FIGS. 21 and 22 although no charge pump circuit is necessary. If the size of a P-channel MOS transistor can be made equal to that of an N-channel MOS transistor formed on a silicon (100) plane, it is possible to provide an inexpensive switching circuit in which no noise is generated from a charge pump circuit. To this end, it is necessary to make the current drivability of a P-channel MOS transistor higher than that of a transistor formed on a silicon (100) plane.

For example, patent references 1 and 2 propose the formation of a P-channel MOS transistor on a (110) plane of silicon in order to increase the current drivability of the transistor. In patent reference 1, silicon having a (100) surface on which an N-channel MOS transistor is formed is etched to form a P-channel MOS transistor on a (110) plane on a side surface. According to the findings of the present inventors, however, a P-channel MOS transistor having a gate insulation film which is a silicon oxide film formed by thermal oxidation on a (110) surface of silicon etched by the conventional method has only impractical characteristics, and cannot be used as a power transistor having a gate-to-source breakdown voltage of 10 V or more. Patent reference 2 aims to form a P-channel transistor on a (110) plane by noting the fact that, as shown in FIG. 23 (FIG. 2 of this reference), when an effective vertical electric field is about 3 V, the mobility of holes on a (110) plane is larger than that of electrons on a (100) plane. Since, however, the breakdown limit of an oxide film is 1 V as an effective vertical electric field, a P-channel MIS transistor is formed by using a high-k material such as tantalum oxide or titanium oxide as a gate insulation film without using any silicon oxide film. Even in this device, as shown in FIG. 23, the mobility is inferior to that of a normal N-channel MOS transistor, so it cannot be said that mobility equal to that of an N-channel MOS transistor is obtained.

Patent Reference 1: Japanese Patent Laid-Open No. 4-372166
Patent Reference 2: Japanese Patent Laid-Open No. 7-231088

DISCLOSURE OF INVENTION

Problem To Be Solved By The Invention

As described above, it is proposed to form a P-channel power MIS field effect transistor on a (110) plane of silicon, but no practical P-channel power MIS field effect transistor having current drivability equal to or higher than that of an N-channel power MOS field effect transistor for the same size has been implemented. Note that the above problem arises not only in MOS transistors but also in general MIS transistors having gate insulation films.

The present invention has been made to solve the above problem, and has as its object to realize a P-channel power MIS field effect transistor by which performance equal to or higher than that of an N-channel power MIS field effect transistor can be obtained for the same size, and a switching circuit using this P-channel power MIS field effect transistor.

Means For Solving The Problem

The present invention provides a P-channel power MIS field effect transistor which comprises a substrate having a silicon region whose surface is substantially a (110) plane, a gate insulation film formed on the surface, and a gate electrode formed on the gate insulation film, and in which the silicon region is used at least as a channel. A contact portion of the gate insulation film, which is in contact with the surface of the silicon region, contains argon, krypton, or xenon, and a source-to-gate breakdown voltage of the P-channel MIS field effect transistor is 10 V or more.

In a configuration example of the P-channel power MIS field effect transistor of the present invention, a content of argon, krypton, or xenon in at least the contact portion of the gate insulation film, which is in contact with the surface of the silicon region, is $5 \times 10^{11}$ cm$^{-2}$ or less as a surface density.

Also, in a configuration example of the P-channel power MIS field effect transistor of the present invention, a content of argon, krypton, or xenon in the gate insulation film is a maximum in an interface in which the gate insulation film is in contact with the gate electrode, and reduces toward an interface in which the gate insulation film is in contact with the surface of the silicon region.

Furthermore, in a configuration example of the P-channel power MIS field effect transistor of the present invention, a gate threshold voltage of the P-channel power MIS field effect transistor is substantially equal to a gate threshold voltage of a P-channel MIS field effect transistor which has the same gate insulation film except that none of argon, krypton, and xenon is contained, and in which the gate insulation film and a gate electrode are formed in a silicon region whose surface is a (100) plane.

In a configuration example of the P-channel power MIS field effect transistor of the present invention, at least the contact portion of the gate insulation film, which is in contact with the surface of the silicon region, is made of a silicon oxide film, silicon oxynitride film, or silicon nitride film.

In a configuration example of the P-channel power MIS field effect transistor of the present invention, at least the contact portion of the gate insulation film, which is in contact with the surface of the silicon region, is made of a silicon oxide film formed by oxidizing the surface of the silicon region by using radical oxygen, and having a thickness of 100 nm or less.

At least the contact portion of the gate insulation film, which is in contact with the surface of the silicon region, may also be a silicon nitride film formed by nitriding the surface of the silicon region by using radical nitrogen or radical NH, and having a thickness of 100 nm or less.

At least the contact portion of the gate insulation film, which is in contact with the surface of the silicon region, may also be a silicon oxynitride film formed by oxynitriding the surface of the silicon region by using radical nitrogen or radical NH and radical oxygen, and having a thickness of 100 nm or less.

A thickness of the gate insulation film is preferably 200 to 1,500 Å.

A portion of the gate insulation film except for the contact portion in contact with the surface of the silicon region may also contain a silicon oxide film, silicon oxynitride film, or silicon nitride film formed by CVD.

In a configuration example of the P-channel power MIS field effect transistor of the present invention, the gate insulation film is formed by using a gas mixture plasma containing a rare gas for generating microwave excitation and an insulation film formation gas.

The rare gas is preferably at least one of argon, krypton, and xenon, and the insulation film formation gas preferably contains at least one of oxygen, nitrogen, and ammonia.

Also, the present invention is a P-channel power MIS field effect transistor which comprises a substrate having a silicon region whose surface is substantially a (110) plane, a gate insulation film formed on the surface, and a gate electrode formed on the gate insulation film, and in which the silicon region is used at least as a channel, wherein a surface roughness of the silicon surface is 0.15 nm or less when expressed by a central line average roughness (Ra), and a source-to-gate breakdown voltage is 10 V or more.

At least a contact portion of the gate insulation film, which is in contact with the surface of the silicon region, preferably contains argon, krypton, or xenon.

Also, in the P-channel power MIS field effect transistor of the present invention, the surface roughness of the silicon surface is 0.11 nm or less when expressed by the central line average roughness Ra.

Also, in the P-channel power MIS field effect transistor of the present invention, the surface roughness of the silicon surface is 0.09 nm or less when expressed by the central line average roughness Ra.

Also, in the P-channel power MIS field effect transistor of the present invention, the surface roughness of the silicon surface is 0.07 nm or less when expressed by the central line average roughness Ra.

The central line average roughness Ra is preferably 0.11 nm or less, more preferably, 0.09 nm or less, and most preferably, 0.07 nm.

Also, in a configuration example of the P-channel power MIS field effect transistor of the present invention, the silicon surface having substantially a (110) plane is one of a (110) plane, (551) plane, (311) plane, (221) plane, (553) plane, (335) plane, (112) plane, (113) plane, (115) plane, (117) plane, (331) plane, (221) plane, (332) plane, (111) plane, and (320) plane.

Also, in a configuration example of the P-channel power MIS field effect transistor of the present invention, the silicon surface having substantially a (110) plane is a (110) plane or (551) plane.

According to Sato et al., FIG. 2 of an article inserted in "Sensors and Actuators 73 (1999)" (p. 122-130) shows that when a (110) plane is etched with an alkali, the surface shape has stripes running in the <−110> direction. A region where the same surface shape as a (110) plane is obtained is a plane which is off-oriented by 0° to 12° in the <100> direction, e.g., a (551) plane which is off-oriented by 8°. A similar surface shape is obtained up to a plane which is off-oriented by 1° in the <−110> direction. Accordingly, the plane orientation which shows the same surface roughness behavior as a (110) plane shown in FIG. 2 of this article is substantially included in a (110) plane orientation.

Sato et al. further report a plane by which carrier electron mobility similar to that of a (110) plane is obtained, in "Physical Review Letters, B4, 1950 (1971)". According to this report, when electrons are allowed to flow in the <−110> direction, an electron moving behavior similar to that of a (110) plane can be obtained even when a plane which is off-oriented by 0 to 35° in the <−110> direction, e.g., a (331) plane, (221) plane, (332) plane, or (111) plane is used. It is also possible to obtain a behavior similar to that of a (110) plane even when a plane which is off-oriented by 0° to 12° in the <110> direction, e.g., a (320) plane is used. Accordingly, the above-mentioned planes and their nearby planes are also substantially included in a (110) plane.

Also, in a configuration example of the P-channel power MIS field effect transistor of the present invention, at least the contact portion of the gate insulation film, which is in contact with the silicon surface, may also be made of a film including at least one of a silicon oxide film, silicon nitride film, and silicon oxynitride film.

Also, in a configuration example of the P-channel power MIS field effect transistor of the present invention, a portion of the gate insulating film except for the contact portion may also include a high-k film containing at least one of a metal silicate containing at least one element selected from Hf, Zr, Ta, Ti, La, Co, Y, and Al, a metal oxide containing at least one element selected from Si, Hf, Zr, Ta, Ti, Y, Nb, Na, Co, Al, Zn, Pb, Mg, Bi, La, Ce, Pr, Sm, Eu, Gd, Dy, Er, Sr, and Ba, a metal nitride containing at least one element selected from Si, Hf, Zr, Ta, Ti, Y, Nb, Na, Co, Al, Zn, Pb, Mg, Bi, La, Ce, Pr, Sm, Eu, Gd, Dy, Er, Sr, and Ba, and a metal oxynitride containing at least one element selected from Si, Hf, Zr, Ta, Ti, Y, Nb, Na, Co, Al, Zn, Pb, Mg, Bi, La, Ce, Pr, Sm, Eu, Gd, Dy, Er, Sr, and Ba.

Also, in a configuration example of the P-channel power MIS field effect transistor of the present invention, the portion of the gate insulation film except for the contact portion may also be made of a film including at least one of a silicon oxide film, a silicon nitride film, a silicon oxynitride film, and the high-k film.

Also, in a configuration example of the P-channel power MIS field effect transistor of the present invention, a content of argon, krypton, or xenon in at least the contact portion of the gate insulation film, which is in contact with the surface of the silicon region, is $5 \times 10^{11}$ cm$^{-2}$ or less.

Also, in a configuration example of the P-channel power MIS field effect transistor of the present invention, a least the contact portion of the gate insulation film, which is in contact with the surface of the silicon region, is formed in an ambient containing at least one of radical oxygen and radical nitrogen by performing one of an oxidation step of oxidizing the silicon surface and a nitriding step of nitriding the silicon surface, or by simultaneously performing the oxidation step and nitriding step in parallel.

Also, the gate insulation film includes a portion formed by using a gas mixture plasma containing a rare gas for generating microwave excitation and an insulation film formation gas.

The rare gas is at least one of krypton, xenon, and argon, and the insulation film formation gas contains at least one of ammonia, nitrogen, and oxygen.

Also, in a configuration example of the P-channel power MIS field effect transistor of the present invention, before a source region, a drain region, a channel region, and the gate insulation film are formed, the silicon surface may also be cleaned by an RCA cleaning step at a low OH concentration.

Also, in a configuration example of the P-channel power MIS field effect transistor of the present invention, a pH of a solution for treating the silicon surface is 7 or less.

Also, in a configuration example of the P-channel power MIS field effect transistor of the present invention, before a source region, a drain region, a channel region, and the gate insulation film are formed, the silicon surface may also be cleaned by a cleaning step including ultrasonic cleaning which suppresses generation of OH.

Also, in a configuration example of the P-channel power MIS field effect transistor of the present invention, before a source region, a drain region, a channel region, and the gate insulation film are formed, the silicon surface may also be cleaned by a cleaning step comprising a first step of performing cleaning by using pure water containing ozone, a second step of performing cleaning by using a cleaning solution containing HF, deaerated $H_2O$, and a surfactant while applying a vibration at a frequency of 500 kHz or more, a third step of performing cleaning by using $H_2O$ containing ozone, a fourth step of performing cleaning by using a cleaning solution containing HF and deaerated $H_2O$ in order to remove an oxide film formed in the third step, and a fifth step of performing cleaning by using $H_2O$ to which hydrogen is added.

Also, in a configuration example of the P-channel power MIS field effect transistor of the present invention, the deaerated $H_2O$ used in the second and fourth steps is $H_2O$ formed by adding hydrogen to deaerated $H_2O$.

Also, in a configuration example of the P-channel power MIS field effect transistor of the present invention, the deaerated $H_2O$ used in the second and fourth steps has a dissolved oxygen concentration of 100 ppb or less.

Also, in a configuration example of the P-channel power MIS field effect transistor of the present invention, before a source region, a drain region, a channel region, and the gate insulation film are formed, the silicon surface may also be cleaned with HF and a cleaning solution prepared by adding hydrogen to $H_2O$ having a dissolved oxygen concentration of 100 ppb or less, while a vibration at a frequency of 500 kHz or more is applied.

Also, in a configuration example of the P-channel power MIS field effect transistor of the present invention, a treatment may also be performed in an apparatus in which a treatment liquid chemical and the silicon surface are not exposed to air from the start to the end of cleaning of the silicon surface.

Also, in a configuration example of the P-channel power MIS field effect transistor of the present invention, after a cleaning step, the silicon surface may also undergo a surface planarizing process including a step of forming a sacrificial oxide film on the silicon surface in an ambient containing oxygen radicals, and a step of removing the sacrificial oxide film.

Also, in a configuration example of the P-channel power MIS field effect transistor of the present invention, after a cleaning step, the silicon surface may also undergo a surface planarizing process by which two steps including a first step of forming an oxide film by oxidation using a wet gas and a second step of etching back the oxide film to a predetermined thickness are repeated a desired number of times, and the oxide film is removed by an aqueous solution containing HF.

Furthermore, the present invention provides a switching circuit wherein a power supply is directly or indirectly connected to one of a source and drain of a P-channel power MIS field effect transistor as described above, a load is connected to the other of the source and drain, and means for applying a driving signal for turning on or off the P-channel power MIS field effect transistor is connected to a gate.

A rated voltage of the power supply is preferably 12 V or more. The means for applying the driving signal preferably comprises a bipolar transistor.

Effects Of The Invention

In the present invention, in a P-channel power MIS field effect transistor which includes a substrate having a silicon region whose surface is substantially a (110) plane, a gate insulation film formed on the surface, and a gate electrode formed on the gate insulation film, and in which the silicon region is used at least as a channel, at least a contact portion of the gate insulation film, which is in contact with the surface of the silicon region, contains argon, krypton, or xenon. This makes it possible to obtain a P-channel power MIS field effect transistor having current drivability equal to or higher than that of an N-channel MOS transistor for the same size, which cannot be achieved or implemented by either a (100) plane or (110) plane by the conventional method.

In addition, in the present invention, the flatness of the silicon surface having substantially a (110) plane is improved from a surface roughness (Ra) of about 1.0 nm, which is obtained by the conventional RCA cleaning, to 0.15 nm or less. Consequently, the current drivability can be improved by about three times from that of a MIS transistor formed by using the conventional RCA cleaning. Accordingly, the P-channel power MIS field effect transistor of the present invention can have current drivability equal to or higher than that of an N-channel power MIS field effect transistor for the same size and the same cost. Furthermore, in the present invention, the reliability of the gate insulation film can also be improved because the interface between the silicon surface and gate insulation film is atomically flat.

BRIEF DESCRIPTION OF DRAWINGS

FIGS. 5A to 5H are sectional views showing the steps of a method of fabricating a P-channel power MIS field effect transistor according to the first embodiment of the present invention;

FIGS. 11A to 11J are sectional views showing the steps of a method of fabricating a P-channel power MIS field effect transistor according to the fourth embodiment of the present invention;

FIGS. 14A to 14J are sectional views showing the steps of a method of fabricating a P-channel power MIS field effect transistor according to the fifth embodiment of the present invention;

DETAILED DESCRIPTION

First Embodiment

An embodiment of the present invention will be explained in detail below. In this embodiment, a P-channel power MIS field effect transistor in which a gate insulation film made of a silicon oxide film is formed on a silicon substrate having a (110) plane on its surface will be described.

Figure 1:
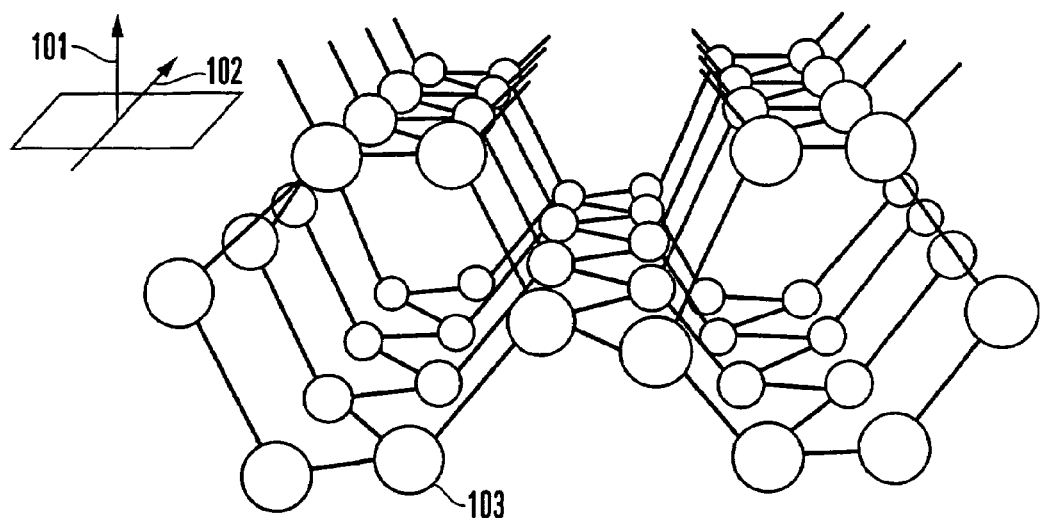
FIG. 1 is a schematic view showing the crystal structure of a (110) silicon substrate on which a field effect transistor is formed in the first embodiment of the present invention.

FIG. 1 is a schematic view showing the crystal structure viewed in the <110> direction of a silicon crystal forming the silicon substrate used in the field effect transistor of this embodiment. Referring to FIG. 1, each of arrows 101 and 102 indicates the <110> direction, showing that silicon atoms 103 are arranged parallel to the interface with the gate insulation film on the substrate uppermost surface on which the field effect transistor is formed.

Figure 2:
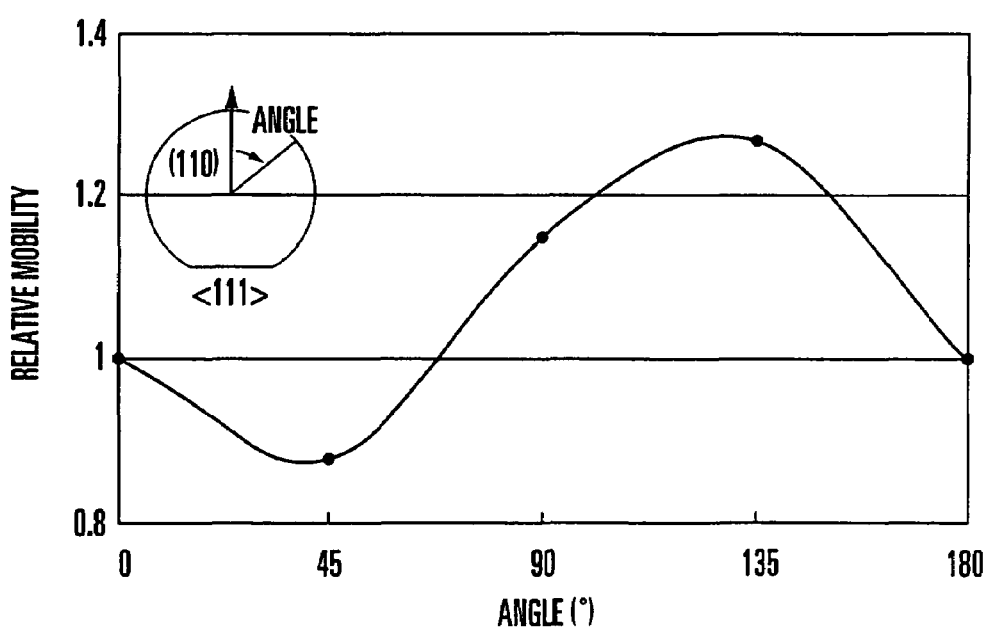
FIG. 2 is a graph showing the dependence of the transistor mobility on the formation direction when a filed effect transistor is formed in a (110) plane in the first embodiment of the present invention.

In addition, in the field effect transistor of this embodiment, a gate electrode is formed on the major surface of the <110> silicon substrate, e.g., a (110) plane, such that the longitudinal direction of the gate electrode extends in the horizontal direction of FIG. 1, and a source region and drain region are formed forward and backward, respectively, with respect to the paper. In this direction, the source and drain regions of the field effect transistor are formed on the <110> silicon plane such that a line connecting the source and drain regions matches the <110> orientation. As shown in FIG. 2, the mobility of the MIS transistor is highest in this direction.

FIG. 2 is a graph showing the dependence of the transistor mobility on the transistor formation direction when a P-channel MIS transistor is formed on a (110) plane. That is, FIG. 2 shows a change in mobility when the transistor is formed by changing the angle in the longitudinal direction of the gate electrode in a (110) plane with respect to a line of intersection with a (111) plane.

Referring to FIG. 2, the mobility is a maximum when the angle formed by the gate electrode longitudinal direction is 135°, i.e., when a (110) plane is formed or the source and drain regions are formed in a (110) plane so that a direction connecting the source and drain regions is the <110> direction. This similarly applies to an N-channel MIS transistor. The mobility of an N-channel MIS transistor formed in this direction is about 1.4 times that in a (100) plane, and the mobility of a P-channel MIS transistor formed in this direction is about 2.5 times that in a (100) plane. The mobility of a MIS transistor formed in this direction increases probably because the effective mass and lattice scattering probability of electrons and holes reduce along the direction from the source region to the drain region.

As shown in FIG. 2, the mobility does not abruptly decrease even at angles around the angle at which it is a maximum, so it is possible to obtain a field effect transistor having mobility equal to that of a (100) N-channel MOS transistor even when a crystal plane orientation of about 60° to 180° is selected. The field effect transistor of this embodiment may also be formed in substantially a (110) plane or in another plane orientation equivalent to a (110) plane or having a plane angle close to that of a (110) plane, e.g., a (551) plane, (331) plane, (221) plane, (321) plane, (531) plane, (231) plane, (351) plane, (320) plane, or (230) plane.

Figure 3A:
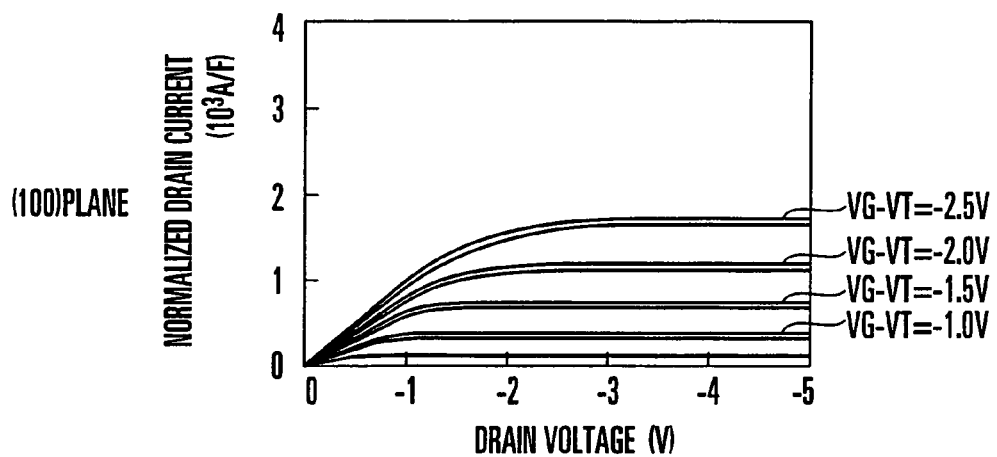
FIGS. 3A and 3B are graphs showing the drain current-drain voltage characteristics of the field effect transistor of the first embodiment of the present invention and a conventional field effect transistor.
Figure 3B:
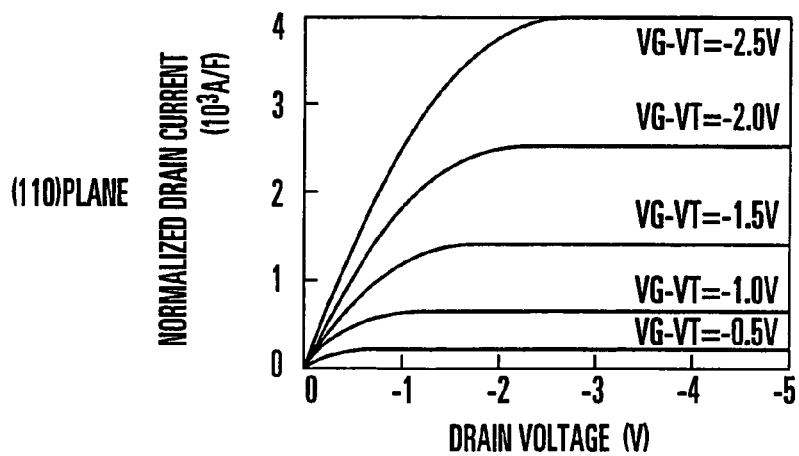

FIGS. 3A and 3B are graphs showing the drain current-drain voltage characteristics of P-channel MIS field effect transistors formed on (100) and (110) silicon substrates, respectively. FIG. 3 shows that the current drivability of the MIS field effect transistor on a (110) plane of this embodiment is 2.5 times that of the transistor on a (100) plane.

Figure 4A:
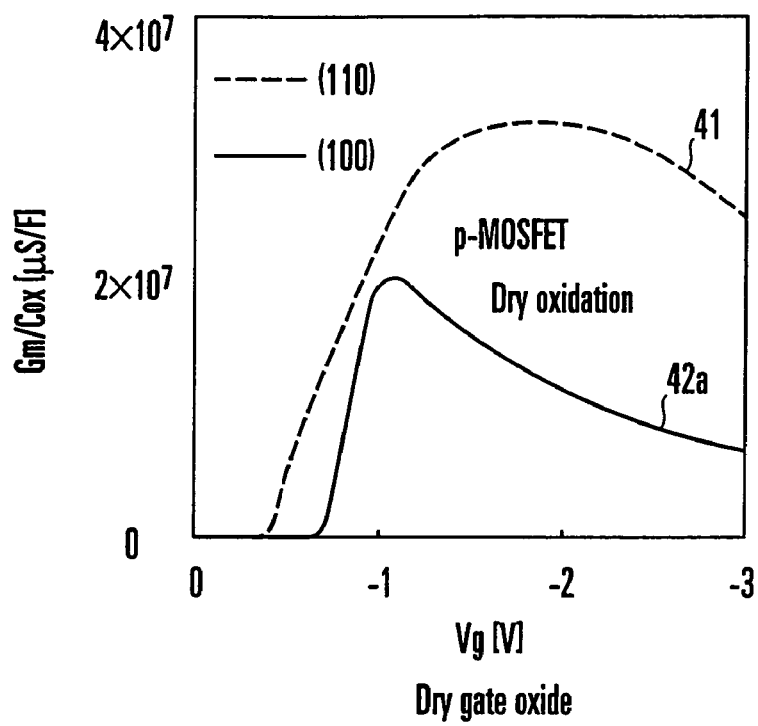
FIGS. 4A and 4B are graphs showing the mutual conductance-gate voltage characteristics of a P-channel MOS transistor of the present invention and a conventional P-channel MOS transistor.
Figure 4B:
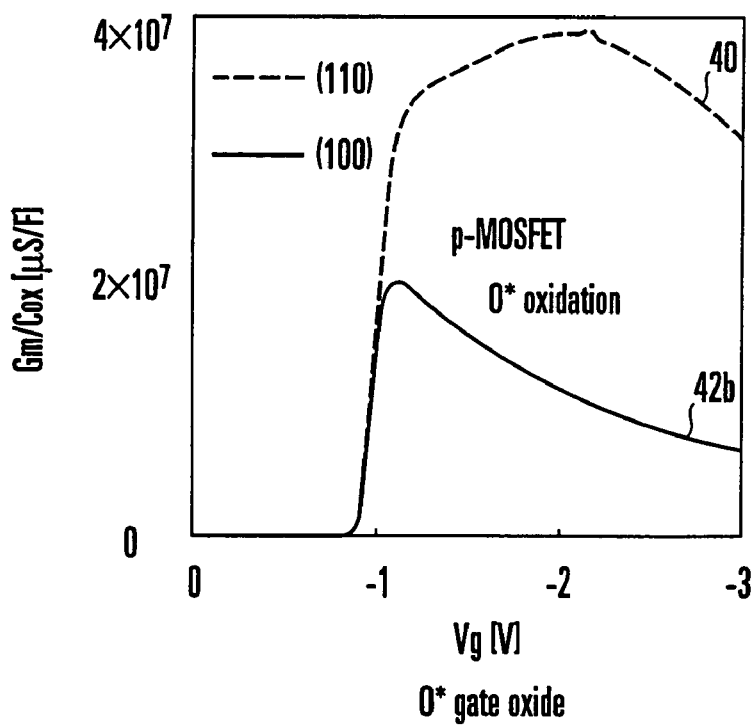

FIG. 4 shows comparison between the gate voltage vs. mutual conductance characteristic of the P-channel MOS transistor of the present invention and those of the conventional P-channel MOS transistors. Each P-channel MOS transistor has a gate length of 100 µm, a gate width of 300 µm, and a gate oxide film thickness of 5 nm. The transistor of the present invention is a P-channel transistor obtained by forming a gate insulation film made of a silicon oxide film on a silicon (110) plane by an oxidation method (to be described later) using oxygen radicals. The conventional transistors are a P-channel transistor obtained by forming a gate insulation film made of a silicon oxide film on a silicon (100) plane by thermal oxidation or oxidation using oxygen radicals, and a P-channel transistor obtained by forming a gate insulation film made of a silicon oxide film on a silicon (110) plane by thermal oxidation. Referring to FIG. 4A, a characteristic 41 of the conventional P-channel transistor obtained by forming a gate insulation film made of a silicon oxide film on a silicon (110) plane by thermal oxidation is superior in mutual conductance to a characteristic 42a of the conventional P-channel transistor obtained by forming a gate oxide film on a silicon (100) plane by thermal oxidation. However, the threshold voltage of this transistor largely deviates and cannot take a predetermined value, so the transistor is impractical. Referring to FIG. 4B, on the other hand, a characteristic 40 of the P-channel MOS transistor of the present invention has a mutual conductance which is three times or more that of a characteristic 42b (equal to the characteristic 42a of the P-channel transistor obtained by forming a gate oxide film on a silicon (100) plane by thermal oxidation) of the conventional P-channel transistor obtained by forming a gate oxide film on a silicon (100) plane by oxidation using oxygen radicals even in a region where the absolute value of the gate voltage is large. Not only the characteristic 40 is superior to the characteristic 41 of the conventional P-channel transistor obtained by forming a gate insulation film made of a silicon oxide film on a silicon (110) plane by thermal oxidation, but also its threshold voltage is equal to that of the conventional P-channel transistor obtained by forming a gate oxide film on a silicon (100) plane by oxidation using oxygen radicals, and hence is equal to that of the P-channel transistor obtained by forming a gate oxide film on a silicon (100) plane by thermal oxidation. Accordingly, this transistor can be used in practice without any problem. Generally, the deviation of the threshold voltage is represented by

[Equation 1]
$$\Delta Vth = \frac{Q_{SS}}{C_{OX}} = \frac{\tau_{OX} \times Q_{SS}}{\varepsilon} \tag{1}$$

where Vth is the threshold value, Cox is the gate insulation film capacitance, Qss is the fixed electric charge in the gate insulation film, $\varepsilon$ is the dielectric constant of the gate insulation film, and $\tau_{OX}$ is the thickness of the gate insulation film. $\Delta Vth$ is large because a large amount of fixed electric charge exists in the gate oxide film formed on a silicon (110) plane by thermal oxidation. Especially in a power device having a gate-to-source breakdown voltage of 10 V or more, the thickness $\tau_{OX}$ must be increased in order to increase the breakdown voltage of the gate insulation film, and as a consequence $\Delta Vth$ further increases from the above equation. Therefore, it is practically impossible to use the conventional P-channel transistor obtained by forming a gate oxide film on a silicon (110) plane by thermal oxidation as a power device. By contrast, the P-channel MOS transistor of the present invention has a thick gate insulation film by which the gate-to-source breakdown voltage is 10 V or more, but its threshold characteristic is equal to that of the conventional P-channel transistor obtained by forming a gate oxide film on a silicon (100) plane. The present invention makes it possible, for the first time, to put a P-channel transistor having a high mutual conductance and high mobility and equivalent to an N-channel MOS transistor to practical use.

A method of fabricating the P-channel power MIS field effect transistor of this embodiment will be explained below with reference to FIG. 5. Note that the example shown in FIG. 5 illustrates steps of fabricating a P-channel transistor having an LDD (Lightly Doped Drain) structure.

First, as shown in FIG. 5A, an N-type silicon wafer substrate 201 having a (110) plane on its surface is prepared, and element isolation is performed on the surface by STI (Shallow Trench Isolation) or the like, thereby forming an element region 202 including source, drain, and channel regions.

Then, RCA cleaning using $NH_4OH$—$H_2O_2$—$H_2O$ (SC1) and HCl—$H_2O_2$—$H_2O$ (SC2) is performed on the element region 202 (FIG. 5B). After organic substances, particles, metal impurities are removed from the entire surface by this RCA cleaning, the silicon surface is oxidized to form a gate insulation film 204 made of a silicon oxide film (FIG. 5C).

Figure 6:
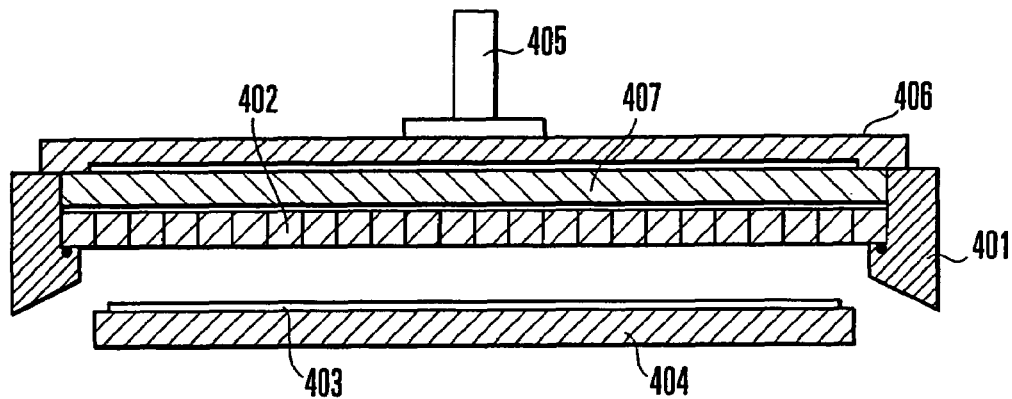
FIG. 6 is a sectional view showing an outline of the arrangement of a microwave-excited plasma apparatus used in the field effect transistor fabrication steps of the first embodiment of the present invention.

FIG. 6 is a sectional view showing the main components of an example of a microwave-excited plasma apparatus using a radial line slot antenna for implementing the gate insulation film 204 of this embodiment. The lower portion including a reaction gas exhausting means of a vacuum vessel is omitted. This microwave-excited plasma apparatus has an arrangement substantially equal to that of the plasma apparatus disclosed in PCT(WO) 10-33362.

The gate insulation film 204 of this embodiment is formed as follows. First, a vacuum vessel (processing chamber) 401 is evacuated, and Kr gas and $O_2$ gas are supplied from a shower plate 402 to set the internal pressure of the processing chamber 401 at about 1 Torr. An N-channel silicon wafer substrate 403 (201 in FIG. 5) having a (110) plane on its surface is placed on a sample table 404 having a heating mechanism, and the temperature of the silicon wafer substrate 403 is set at about 400° C. When this temperature setting ranges from 200° C. to 550° C., the results to be described below are substantially the same.

Subsequently, a microwave at 2.45 GHz is supplied from a coaxial waveguide 405 into the processing chamber 401 via a radial line slot antenna 406 and dielectric plate 407, thereby generating a high-density plasma in the processing chamber 401. When the frequency of the supplied microwave ranges from 900 MHz to 10 GHz, the results to be described below are substantially the same. In this embodiment, the spacing between the shower plate 402 and substrate 403 is set to 6 cm. The narrower the spacing, the faster the film formation. Although film formation is performed using the plasma apparatus having the radial line slot antenna in this embodiment, a microwave may also be supplied into the processing chamber by using another method.

In the microwave-excited plasma in which Kr gas and $O_2$ gas are mixed, Kr* and $O_2$ molecules in an intermediate excited state collide against each other, and this efficiently generates atomic oxygen O*. This atomic oxygen oxides the substrate surface. Conventional silicon surface oxidation is performed by $H_2O$ molecules and $O_2$ molecules, and the processing temperature is extremely high, i.e., 800° C. or more. In this embodiment, however, oxidation by atomic oxygen can be performed at a sufficiently low temperature, i.e., 550° C. or less.

Figure 7:
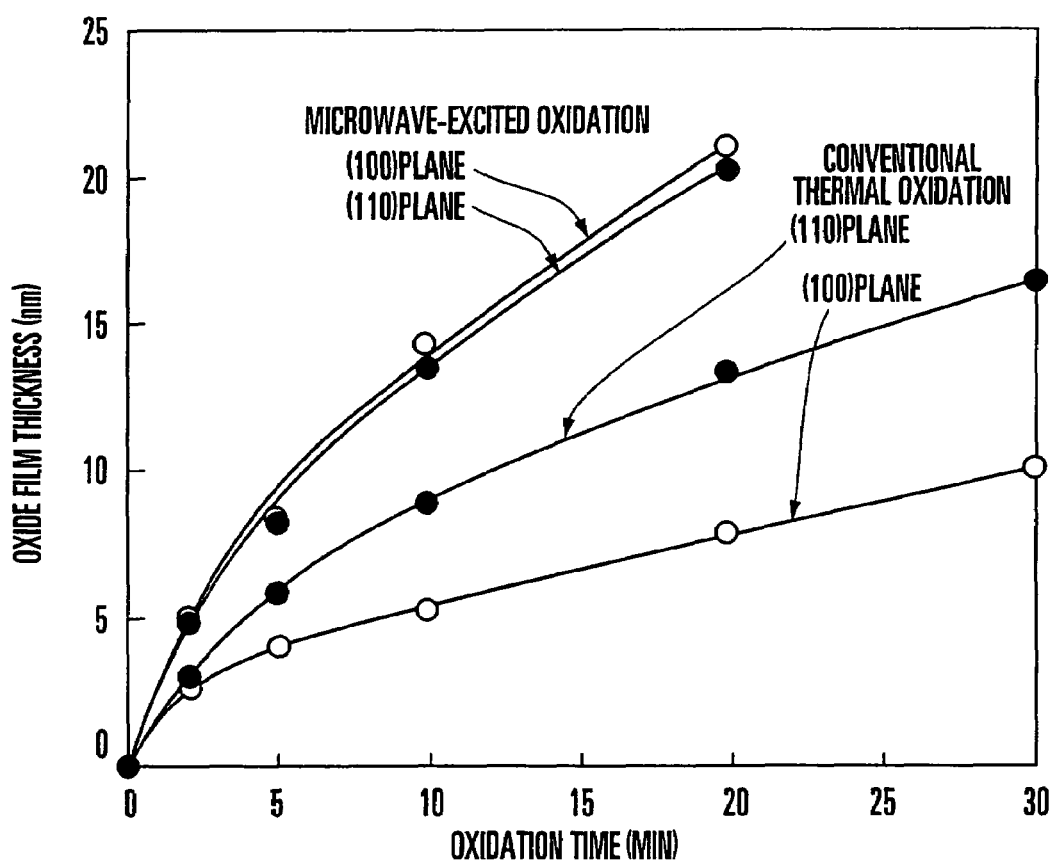
FIG. 7 is a graph showing the dependence of the silicon oxide film thickness on the formation time when the silicon crystal plane orientation is changed.

FIG. 7 shows the dependence of the relationship between the oxide film thickness and oxidation time on the plane orientation during silicon substrate surface oxidation using a microwave-excited $Kr/O_2$ plasma. Silicon substrates are (100) and (110) substrates. FIG. 7 also shows the dependence on the oxidation time of conventional dry thermal oxidation at 900° C. In the conventional high-temperature thermal oxidation technique, $O_2$ molecules and $H_2O$ molecules diffuse through the oxide film formed on the surface and reach the interface between silicon and the silicon oxide film, thereby contributing to oxidation. This changes the oxide film growth rate in accordance with the plane orientation. However, in silicon substrate surface oxidation using the microwave-excited $Kr/O_2$ plasma as in this embodiment, the growth rate of the silicon oxide film has almost no dependence on any plane orientation except for those shown in FIG. 7.

Also, the interface level density between the silicon oxide film and silicon was measured by low-frequency C-V measurement. Consequently, the interface level density of the silicon oxide film formed using the microwave-excited plasma was low, i.e., was favorable in any plane orientation including a (100) plane and (110) plane.

As described above, although the silicon oxide film formed by the microwave-excited $Kr/O_2$ plasma is oxidized at a low temperature of 400° C., it is possible to obtain electrical characteristics equal to or better than those of the conventional (100) high-temperature thermal oxide film in any plane orientation including a (100) plane and (110) plane.

This effect is obtained partly because Kr is contained in the silicon oxide film immediately after film formation. Kr contained in the silicon oxide film presumably alleviates the stress in the film or in the interface between silicon and the silicon oxide film, reduces the electric charge in the film and the interface level density, and greatly improves the electrical characteristics of the silicon oxide film. Especially when Kr is contained at a surface density of $5 \times 10^{11}$ cm$^{-2}$ or less, the electrical characteristics and reliability characteristics of the silicon oxide film improve. Similar results are obtained by using Ar or Xe instead of Kr. Kr is particularly favorable to an oxide film.

Returning to the explanation of FIG. 5, boron is ion-implanted into the entire surface of the silicon wafer substrate 201 on which the gate insulation film 204 is formed, in order to control the threshold voltage (FIG. 5D). After this boron ion implantation, a polysilicon film is deposited on the entire surface of the silicon wafer substrate 201, and patterned to form a polysilicon electrode (gate electrode) 205 on the gate insulation film 204 in the element region 202 (FIG. 5E).

After the formation of the gate electrode 205, boron is ion-implanted at a low concentration to form P-source and P-drain regions 206 which reduce a high electric field (FIG. 5F). Then, a silicon oxide film is deposited on the entire surface of the silicon wafer substrate 201 by CVD or the like so as to cover the gate electrode 205, and anisotropic etching is performed to form a sidewall insulation film 207 on the side walls of the gate electrode 205 (FIG. 5G).

After that, a P-type impurity such as boron is ion-implanted at a high concentration to form P$^+$-source and P$^+$-drain regions 208 (FIG. 5H). Finally, holes are formed in the insulation film 204 above the P$^+$-source and P$^+$-drain regions 208, and a source electrode and drain electrode (not shown) are formed by aluminum or the like, thereby completing the fabrication of the P-channel power MIS field effect transistor.

In this embodiment as described above, it is possible to obtain current drivability about 2.5 times that of a P-channel MIS transistor formed on a silicon surface having a (100) plane, and obtain a P-channel MIS transistor having current drivability equal to that of an N-channel power MIS field effect transistor for the same size and the same cost, which cannot be obtained by the conventional P-channel MIS transistor formed on (110) silicon.

Figure 8:
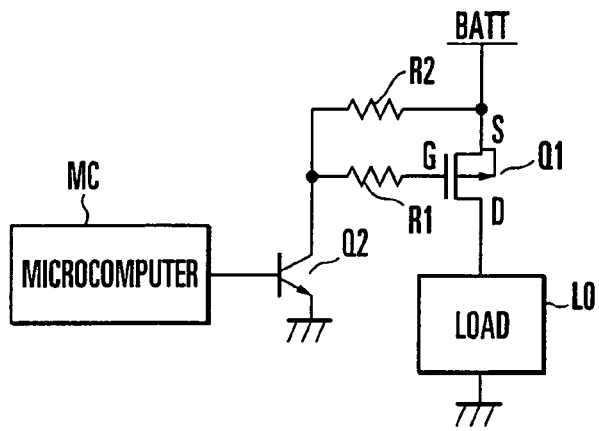
FIG. 8 is a circuit diagram showing the arrangement of a switching circuit using the P-channel power MIS field effect transistor of the first embodiment of the present invention.
Figure 21:
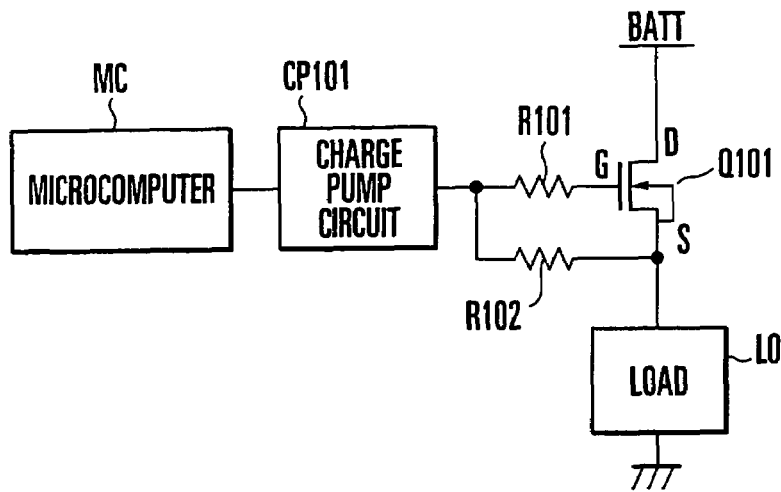
FIG. 21 is a circuit diagram showing the arrangement of a conventional switching circuit.

FIG. 8 is a circuit diagram showing an example of a switching circuit using the P-channel power MIS field effect transistor of this embodiment, in which the same reference numerals as in FIG. 21 denote the same parts. As in FIG. 21, this switching circuit shown in FIG. 8 has an arrangement in which a P-channel power MIS field effect transistor Q1 as a switching element is inserted in the high-potential side of a power supply line to a load LO, and includes the transistor Q1, an NPN transistor Q2, and resistors R1 and R2. The power supply voltage (battery rated voltage) is 12 V.

Figure 9:
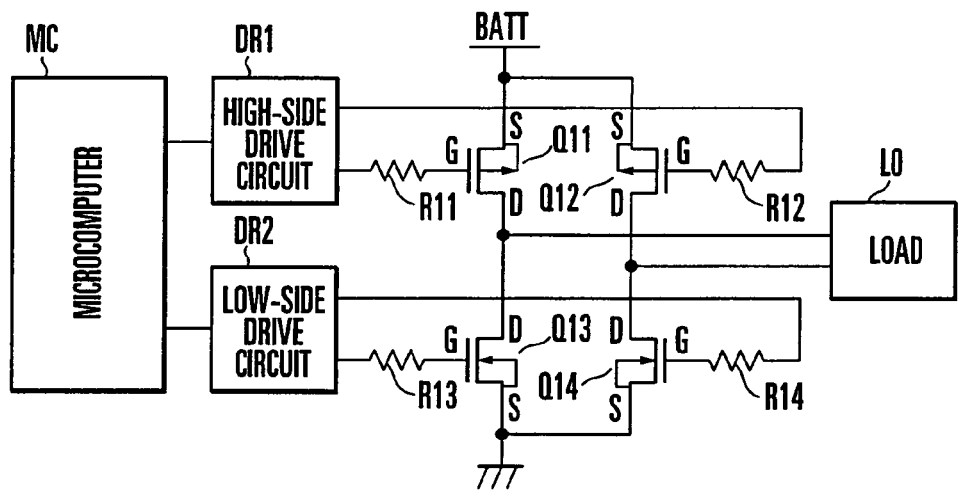
FIG. 9 is a circuit diagram showing the arrangement of another switching circuit using the P-channel power MIS field effect transistor of the first embodiment of the present invention.
Figure 22:
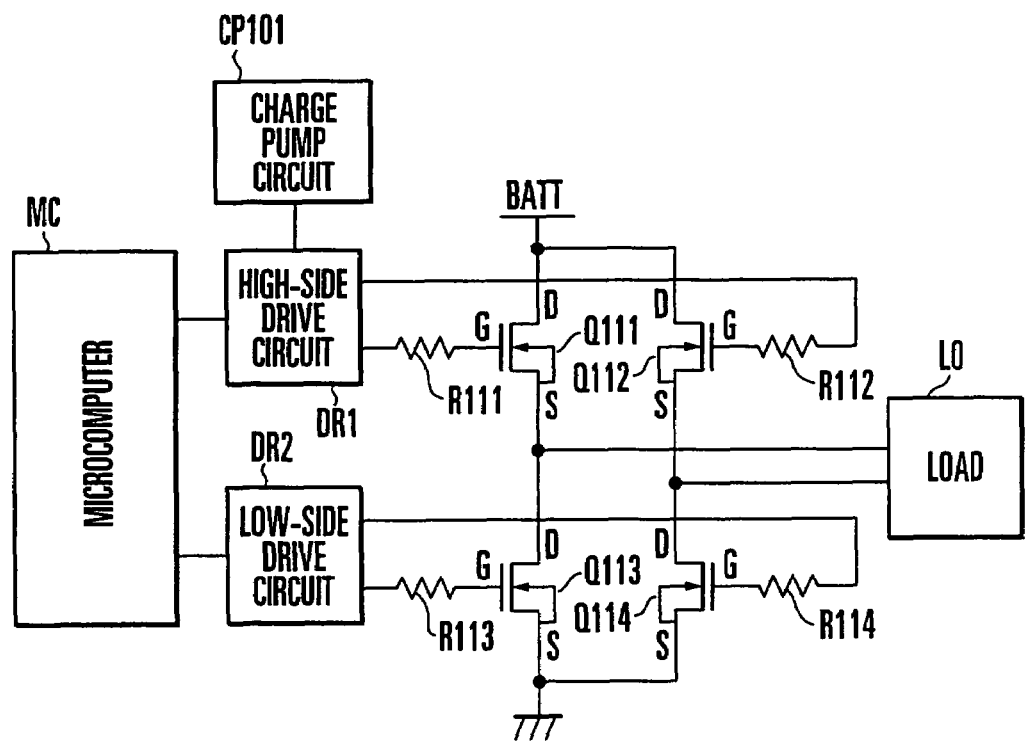
FIG. 22 is a circuit diagram showing the arrangement of another conventional switching circuit.
Figure 23:
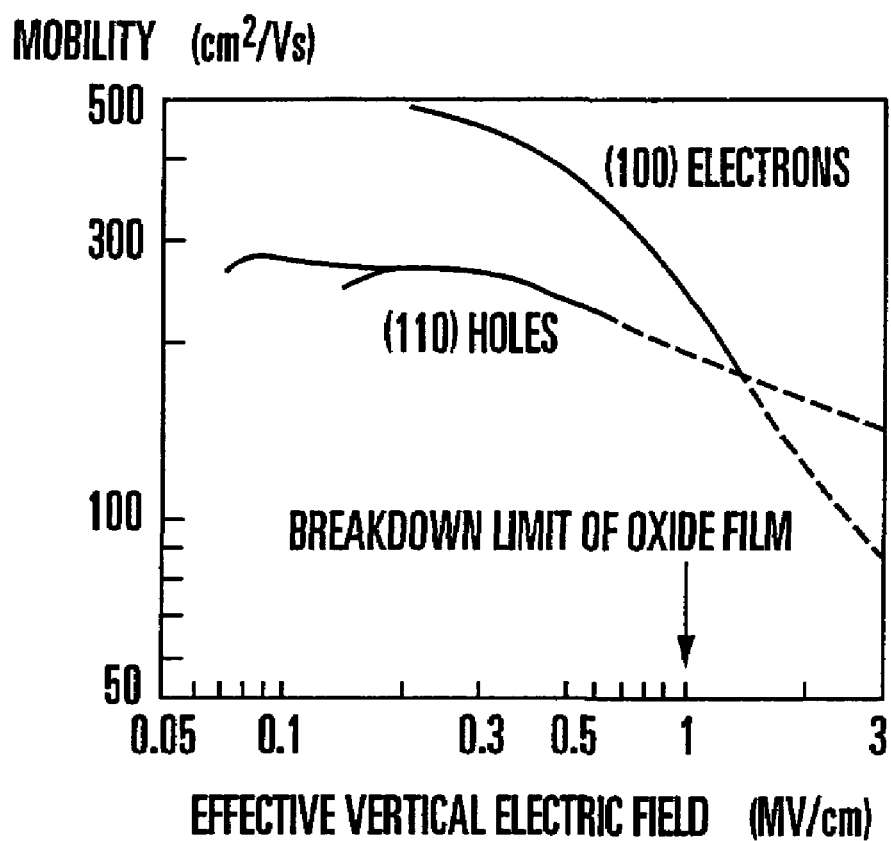
FIG. 23 is a graph showing the characteristics of a conventional P-channel MOS transistor.

FIG. 9 is a circuit diagram showing another example of the switching circuit using the P-channel power MIS field effect transistor of this embodiment, in which the same reference numerals as in FIG. 22 denote the same parts. As in FIG. 22, this switching circuit shown in FIG. 9 has an arrangement in which P-channel power MIS field effect transistors Q11 and Q12 are inserted in the high-potential side of a power supply line to a load LO, and N-channel power MIS field effect transistors Q13 and Q14 are inserted in the low-potential side of the power supply line, and includes the transistors Q11, Q12, Q13, and Q14, resistors R11, R12, R13, and R14, a high-side drive circuit DR1, and a low-side drive circuit DR2.

In each of FIGS. 8 and 9, it is unnecessary to use a charge pump circuit which is conventionally necessary, and a P-channel power MIS field effect transistor equal in size to an N-channel power MIS field effect transistor can be used. This makes it possible to reduce the cost. In the case shown in FIG. 8, one bipolar NPN transistor is necessary, but the cost of the switching circuit can be reduced because the bipolar transistor is not so expensive as the charge pump circuit.

Note that the gate silicon oxide film formed by the microwave-excited plasma in this embodiment need only exist in at least a portion in contact with silicon, and an insulation film made of a different material, e.g., a silicon nitride film, aluminum oxide film, tantalum oxide film, hafnium oxide film, or zirconium oxide film may also be stacked on this gate silicon oxide film. In this embodiment, the thickness of the gate oxide film is 40 nm because a P-channel power MIS field effect transistor having a gate-to-source breakdown voltage of 20 V is formed (because a power transistor for use in an automobile electronic part to be driven by a battery having a rated voltage of 12 V is formed). When the gate-to-source breakdown voltage is, e.g., 60 V, however, the thickness of a gate silicon oxide film formable by the microwave-excited plasma is about a few ten nm. Therefore, it is also possible to obtain a gate insulation film having a desired thickness (1,200 to 1,500 Å) by forming, on this gate silicon oxide film, an insulation film by another fabrication method, e.g., microwave-excited, high-density plasma CVD. The thickness of a gate silicon oxide film for obtaining a gate-to-source breakdown voltage of 10 V is 20 nm.

Also, to implement the gate silicon oxide film of this embodiment, it is also possible to use another plasma process apparatus capable of low-temperature oxide film formation using a plasma, instead of the apparatus shown in FIG. 6. For example, a gate silicon oxide film may also be formed by a two-stage shower plate type plasma process apparatus having a first gas discharging means for discharging Kr gas for exciting a plasma by a microwave, and a second gas discharging means for discharging oxygen gas.

A silicon wafer having a (110) plane on its surface can be either a bulk crystal wafer or a silicon on insulator (SOI) wafer having a silicon layer formed on a buried insulation film. Either a silicon substrate or metal layer can exist below the buried insulation film of the SOI wafer. An SOI wafer in which a low-resistance metal layer made of copper or the like is formed below a buried insulation film is more advantageous for high-speed operations.

Secone Embodiment

As the second embodiment of the present invention, a P-channel power MIS field effect transistor in which a gate insulation film made of a silicon oxynitride film is formed on a silicon substrate having a (110) plane on its surface will be described below.

Even when a field effect transistor using a silicon oxynitride film as a gate insulation film is to be formed, the highest mobility is given by the arrangement shown in FIG. 1 in which on a <110> silicon substrate, silicon atoms on the uppermost surface are arranged parallel to the interface with the gate insulation film, a gate electrode is formed such that its longitudinal direction is the horizontal direction of the paper, and a source region and drain region are formed forward and backward, respectively, with respect to the paper.

The current drivability of the MIS field effect transistor of this embodiment formed in this direction is higher than that of the first embodiment because the dielectric constant of the silicon oxynitride film is higher than that of the silicon oxide film. The current drivability of the P-channel MIS field effect transistor of this embodiment is about 2.8 times that of a P-channel MIS field effect transistor in which a gate insulation film made of a silicon oxide film is formed on a <100> silicon substrate. The mobility of the MIS field effect transistor of this embodiment increases because, as in the first embodiment, the effective mass and lattice scattering probability of electrons and holes reduce along the direction from the source region to the drain region.

In this embodiment as described above, the current drivability of the P-channel power MIS field effect transistor can be made higher than that of the first embodiment.

As a plane orientation which increases the mobility of this embodiment, as in the first embodiment, the field effect transistor of this embodiment may also be formed in substantially a (110) plane or in another plane orientation equivalent to a (110) plane or having a plane angle close to that of a (110) plane, e.g., a (551) plane, (331) plane, (221) plane, (321) plane, (531) plane, (231) plane, (351) plane, (320) plane, or (230) plane.

As in the first embodiment, the gate silicon oxynitride film of the P-channel power MIS field effect transistor of this embodiment is implemented by the microwave-excited plasma apparatus using the radial line slot antenna shown in FIG. 6. The gate silicon oxynitride film of this embodiment is formed as follows.

First, a vacuum vessel (processing chamber) 401 is evacuated, and Kr gas, $O_2$ gas, and $NH_3$ gas are supplied from a shower plate 402 to set the internal pressure of the processing chamber 401 at about 1 Torr. An N-channel silicon wafer substrate 403 (201 in FIG. 5) having a (110) plane on its surface is placed on a sample table 404 having a heating mechanism, and the temperature of the silicon wafer substrate 403 is set at about 400° C.

Subsequently, a microwave at 5.45 GHz is supplied from a coaxial waveguide 405 into the processing chamber 401 via a radial line slot antenna 406 and dielectric plate 407, thereby generating a high-density plasma in the processing chamber 401. The spacing between the shower plate 402 and substrate 403 is set to about 6 cm. Although film formation is performed using the plasma apparatus having the radial line slot antenna in this embodiment, a microwave may also be supplied into the processing chamber by using another method.

In the high-density excited plasma in which Kr gas, $O_2$ gas, and $NH_3$ gas are mixed, Kr*, $O_2$ molecules, and $NH_3$ molecules in an intermediate excited state collide against each other, and this efficiently generates atomic oxygen O* and NH*. This radical oxynitrides the silicon substrate surface.

In the silicon surface oxynitriding using the microwave-excited plasma, the growth rate of the silicon oxynitride film has almost no dependence on any plane orientation. Also, the interface level density between the silicon oxynitride film and silicon is low, i.e., favorable in any plane orientation including a (100) plane and (110) plane.

In the gate silicon oxynitride film formation of this embodiment, the existence of hydrogen is an important factor. Since hydrogen exists in the plasma, dangling bonds in the silicon oxynitride film and in the interface between the silicon oxynitride film and silicon terminate by forming Si—H bonds and N—H bonds, and this eliminates electron traps in the silicon oxynitride film and in the interface. The existence of the Si—H bonds and that of the N—H bonds in the silicon oxynitride film of this embodiment are confirmed by measuring the infrared absorption spectrum and the X-ray photoelectron spectroscopic spectrum, respectively. The existence of hydrogen eliminates the hysteresis of the CV characteristic, and decreases the surface density of the film interface between silicon and the silicon oxynitride film to $3 \times 10^{10}$ $cm^{-2}$. When a silicon oxynitride film is to be formed by using a gas mixture of a rare gas (Ar, Xe, or Kr), 02, and $N_2/H_2$, traps of electrons and holes in the film abruptly reduce by setting the partial pressure of hydrogen at 0.5% or more.

Note that the gate silicon oxynitride film formed by the microwave-excited plasma in this embodiment need only exist in at least a portion in contact with silicon, and an insulation film made of a different material, e.g., a silicon nitride film, aluminum oxide film, tantalum oxide film, hafnium oxide film, or zirconium oxide film may also be stacked on this gate silicon oxynitride film. Especially when a P-channel power MIS field effect transistor is to be formed as in this embodiment, a gate insulation film having a desired thickness may also be obtained by forming an insulation film on the gate silicon oxynitride film by another fabrication method, e.g., CVD.

Also, to implement the gate silicon oxynitride film of this embodiment, it is also possible to use another plasma process apparatus capable of low-temperature oxide film formation using a plasma, instead of the apparatus shown in FIG. 6. For example, a gate silicon oxynitride film may also be formed by a two-stage shower plate type plasma process apparatus having a first gas discharging means for discharging Ar, Xe, or Kr gas for exciting a plasma by a microwave, and a second gas discharging means for discharging $O_2$ and $NH_3$ gas (or $N_2/H_2$ gas). Ar gas or Xe gas may also be used as Kr gas. The use of Xe gas is preferable.

Third Embodiment

As the third embodiment of the present invention, a P-channel power MIS field effect transistor in which a gate insulation film made of a silicon nitride film is formed on a silicon substrate having a (110) plane on its surface will be described below.

Even when a field effect transistor using a silicon nitride film as a gate insulation film is to be formed, the highest mobility is given by the arrangement shown in FIG. 1 in which on a <110> silicon substrate, silicon atoms on the uppermost surface are arranged parallel to the interface with the gate insulation film, a gate electrode is formed such that its longitudinal direction is the horizontal direction of the paper, and a source region and drain region are formed forward and backward, respectively, with respect to the paper.

The current drivability of the MIS field effect transistor of this embodiment formed in this direction is higher than that of the first embodiment by an amount in which the dielectric constant of the silicon nitride film is higher than that of the silicon oxide film. The dielectric constant of the silicon nitride film was about twice that of the silicon oxide film. The current drivability of the P-channel MIS field effect transistor of this embodiment is about 5 times that of a P-channel MIS field effect transistor in which a gate insulation film made of a silicon oxide film is formed on a <100> silicon substrate. The mobility of the MIS field effect transistor of this embodiment increases because, as in the first embodiment, the effective mass and lattice scattering probability of electrons and holes reduce along the direction from the source region to the drain region.

In this embodiment as described above, the current drivability of the P-channel power MIS field effect transistor can be made higher than that of the second embodiment.

As a plane orientation which increases the mobility of this embodiment, as in the first embodiment, the field effect transistor of this embodiment may also be formed in substantially a (110) plane or in another plane orientation equivalent to a (110) plane or having a plane angle close to that of a (110) plane, e.g., a (551) plane, (331) plane, (221) plane, (321) plane, (531) plane, (231) plane, (351) plane, (320) plane, or (230) plane.

As in the first embodiment, the gate silicon nitride film of the P-channel power MIS field effect transistor of this embodiment is implemented by the microwave-excited plasma apparatus using the radial line slot antenna shown in FIG. 6. The gate silicon nitride film of this embodiment is formed as follows.

First, a vacuum vessel (processing chamber) 401 is evacuated, and Kr gas and $NH_3$ gas are supplied from a shower plate 402 to set the internal pressure of the processing chamber 401 at about 1 Torr. An N-channel silicon wafer substrate 403 (201 in FIG. 5) having a (110) plane on its surface is placed on a sample table 404 having a heating mechanism, and the temperature of the silicon wafer substrate 403 is set at about 400° C.

Subsequently, a microwave at 2.45 GHz is supplied from a coaxial waveguide 405 into the processing chamber 401 via a radial line slot antenna 406 and dielectric plate 407, thereby generating a high-density plasma in the processing chamber 401. The spacing between the shower plate 402 and substrate 403 is set to about 6 cm. Although film formation is performed using the plasma apparatus having the radial line slot antenna in this embodiment, a microwave may also be supplied into the processing chamber by using another method.

In the high-density excited plasma in which Kr gas and $NH_3$ gas are mixed, Kr* and $NH_3$ molecules in an intermediate excited state collide against each other, and this efficiently generates NH*. This radical nitrides the silicon substrate surface.

In the silicon surface nitriding using the microwave-excited plasma, the growth rate of the silicon nitride film has almost no dependence on any plane orientation. Also, the interface level density between the silicon nitride film and silicon is low, i.e., favorable in any plane orientation including a (100) plane and (110) plane.

In the gate silicon nitride film formation of this embodiment, the existence of hydrogen is an important factor. Since hydrogen exists in the plasma, dangling bonds in the silicon nitride film and in the interface between the silicon nitride film and silicon terminate by forming Si—H bonds and N—H bonds, and this eliminates electron traps in the silicon nitride film and in the interface. The existence of the Si—H bonds and that of the N—H bonds in the silicon nitride film of this embodiment are confirmed by measuring the infrared absorption spectrum and the X-ray photoelectron spectroscopic spectrum, respectively. The existence of hydrogen eliminates the hysteresis of the CV characteristic, and decreases the surface density of the film interface between silicon and the silicon nitride film to $3 \times 10^{10}$ $cm^{-2}$. When a silicon nitride film is to be formed by using a gas mixture of a rare gas (Ar, Xe, or Kr) and $N_2/H_2$, traps of electrons and holes in the film abruptly reduce by setting the partial pressure of hydrogen at 0.5% or more.

Note that the gate silicon nitride film formed by the microwave-excited plasma in this embodiment need only exist in at least a portion in contact with silicon, and an insulation film made of a different material, e.g., a silicon nitride film, aluminum oxide film, tantalum oxide film, hafnium oxide film, or zirconium oxide film may also be stacked on this gate silicon nitride film. Especially when a P-channel power MIS field effect transistor is to be formed as in this embodiment, a gate insulation film having a desired thickness may also be obtained by forming an insulation film on the gate silicon nitride film by another fabrication method, e.g., CVD.

Also, to implement the gate silicon nitride film of this embodiment, it is also possible to use another plasma process apparatus capable of low-temperature nitride film formation using a plasma, instead of the apparatus shown in FIG. 6. For example, a gate silicon nitride film may also be formed by a two-stage shower plate type plasma process apparatus having a first gas discharging means for discharging Ar, Xe, or Kr gas (Xe is favorable) for exciting a plasma by a microwave, and a second gas discharging means for discharging $NH_3$ gas (or $N_2/H_2$ gas).

Fourth Embodiment

The fourth embodiment of the present invention in which the characteristics of a P-channel power MIS field effect transistor are improved by reducing the roughness of a silicon surface will be explained below.

The present inventors have found by observation that when a field effect transistor is fabricated, the surface of an element region is inevitably roughened by, e.g., an alkali treatment and pure water rinsing during RCA cleaning.

On the other hand, the mobility of carriers in a field effect transistor is an index of the current drivability of the transistor, and holes are carriers in a P-channel field effect transistor. Generally, to improve the current drivability of a field effect transistor, the carrier mobility must be increased by decreasing the roughness of the surface of an element region.

More specifically, the present inventors have confirmed that when normal RCA cleaning is used, the surface roughness of silicon in an element region is about 0.5 to 1.5 nm when expressed by a central line average roughness Ra, and a gate insulation film is formed on this silicon surface. A gate insulation film is generally a silicon oxide film formed by using dry $O_2$. In oxidation using dry $O_2$, however, the oxidation species presumably enters from a (111) facet plane to preferentially advance the oxidation. It was confirmed that as a consequence, the roughness of the interface between the silicon surface and gate silicon oxide film further increased.

When a field effect transistor is fabricated by using silicon having microroughness caused by RCA cleaning, not only the current drivability of the field effect transistor decreases, but also field concentration occurs in projecting portions and this readily causes insulation breakdown when a voltage is actually applied to the gate electrode. Especially when silicon having a (110) plane on its surface is used, the roughness increases during an alkali treatment, and this decreases the mobility when this silicon is used.

This embodiment improves the characteristics of a P-channel power MIS field effect transistor by reducing the roughness of the silicon surface as described above.

First, the principle of this embodiment will be explained below. The factors determining the rate (the rate-determining factors) of the mobility of carriers on a (110) silicon surface are normally (1) impurity scattering $\mu_{co}$, (2) phonon scattering $\mu_{ph}$, and (3) surface roughness scattering $\mu_{sr}$. It is also known that observed mobility $\mu$ is the sum of these three factors, given by the Matterson's law, and represented by

[Equation 2]

$$\mu^{-1} = \mu_{co}^{-1} + \mu_{ph}^{-1} + \mu_{sr}^{-1} \qquad (2)$$

It is found that carriers in a (110) plane are largely affected by the roughness of the silicon surface (i.e., the surface roughness scattering $\mu_{sr}$) of the three rate-determining factors described above. When the relationship between the mobility and effective electric field is cryogenically examined in practice, it is possible to substantially ignore the impurity scattering $\mu_{co}$ and phonon scattering $\mu_{ph}$ and extract only the influence of the surface roughness scattering $\mu_{sr}$. When the relationship between the mobility and effective electric field was checked at 77 K, the influence the interface roughness had on the mobility was larger in a (110) plane than in a (100) plane.

Figure 10:
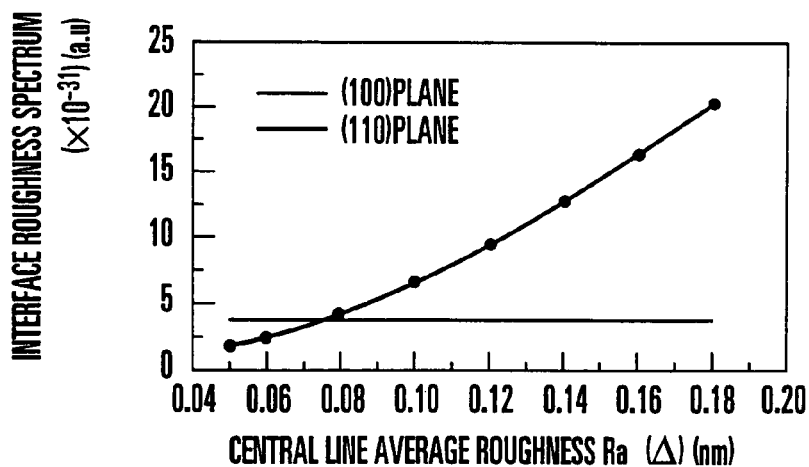
FIG. 10 is a graph showing the results of simulation of checking the relationship between the central line average roughness of the silicon surface and the interface roughness spectrum.

FIG. 10 shows the results of examination by simulation on the relationship between the central line average roughness Ra and interface roughness spectrum. Since the central line average roughness Ra actually realizable by using the conventional method is about 0.4 nm, the relationship between the central line average roughness Ra and interface roughness spectrum shown in FIG. 10 is evidently obtained in an Ra region smaller than the limit of the conventional method. The interface roughness spectrum herein mentioned is not roughness physically obtained by measurement or the like, but roughness actually sensed by carriers, and is defined by

[Equation 3]

$$\langle |\Delta q|^2 \rangle = \pi \Delta^2 \Lambda^2 e^{(q^2 \Lambda^2/4)} \qquad (3)$$

where $\Delta$ is the central line average roughness Ra of the interface roughness, $\Lambda$ is the average period of the interface roughness, and q is the difference (i.e., q=k-k') between an incident wave number vector k and reflected wave number vector k' of carriers with respect to the interface.

As shown in FIG. 10, in a (100) plane, the change in interface roughness spectrum is negligibly smaller than that in central line average roughness Ra. By contrast, in a (110) plane, as the central line average roughness Ra decreases, the interface roughness spectrum decreases, and the carrier mobility rises. In addition, as can be seen from FIG. 10, it can be estimated by simulation that the mobility in (110) silicon improves to the same level as the electron mobility in (100) silicon when the central line average roughness Ra is decreased to 0.07 nm or less.

Accordingly, the gist of this embodiment is to obtain a P-channel power MIS field effect transistor by using a method capable of planarizing the central line average roughness Ra of the (110) silicon surface to 0.04 nm or less as the conventional limit, particularly, 0.15 nm or less, and preferably, 0.07 nm or less, and by using the planarized silicon.

A method of fabricating the P-channel power MIS field effect transistor according to the fourth embodiment of the present invention will be described below with reference to FIG. 11.

First, as shown in FIG. 11A, an N-type silicon wafer substrate 301 having a (110) plane on its surface is prepared, and element isolation is performed on the surface by STI or the like, thereby forming an element region 302 including source, drain, and channel regions.

Then, RCA cleaning is performed on the element region 302 (FIG. 11B). It is found that in a roughness region in which microroughness is a problem, an increase in roughness during SC1 cleaning as one step of RCA cleaning must also be taken into consideration. In effect, during SC1 cleaning as one step of RCA cleaning, the silicon surface was etched depending on the OH concentration, and this etching increased the roughness.

By taking this into account, SC1 cleaning at a low OH concentration is performed in this embodiment. The typical conventional SC1 treatment uses a liquid chemical in which $NH_4OH:H_2O_2:H_2O=1:1:5$. In this embodiment, however, $NH_4OH:H_2O_2:H_2O=0.05:1:5$, i.e., the OH concentration is lower than that in the conventional SC1 treatment.

Also, when the defect density of, e.g., COP (Crystal Originated Particle) was high in a silicon crystal, the increase in surface roughness accelerated during the SC1 treatment. In addition, micropits were formed on the surface by the defects after the SC1 treatment, and this deteriorated the oxide film breakdown voltage. The COP density is especially high when a CZ wafer is used.

To suppress the increase in surface roughness during SC1 cleaning, therefore, it is preferable to use silicon obtained by decreasing the level of residual oxygen to about $5 \times 10^{16}/cm^3$ by performing, e.g., hydrogen annealing or argon annealing on the silicon surface, or a silicon wafer having a surface on which Si is epitaxially grown. In this embodiment, a silicon wafer having a surface on which Si was epitaxially grown was used.

When the low-OH-concentration SC1 step was used as described above, the silicon surface had a central line average roughness Ra of about 0.15 nm. When a P-channel transistor is fabricated using silicon having this surface roughness, a transistor having mobility higher than that of the conventional P-channel transistor can be obtained. However, as also shown in FIG. 10, when (110) silicon is used, the central line average roughness Ra having this value cannot achieve the same mobility as when (100) silicon is used.

In this embodiment, therefore, to further planarize the surface roughness, as shown in FIG. 11C, as a process of planarizing the silicon surface of the element region 302, the surface of the element region 302 is oxidized in an ambient containing radical oxygen, thereby forming a sacrificial oxide film 303. By forming the sacrificial oxide film 303 in the radical oxygen ambient, the surface of the sacrificial oxide film 303 was more planarized than before the sacrificial oxide film 303 was formed.

The radical oxidation used in FIG. 11C will be explained in detail below. The radical oxidation process of this embodiment uses the microwave-excited plasma apparatus shown in FIG. 6. Referring to FIG. 6, a vacuum vessel (processing chamber) 401 is first evacuated, and Kr gas and $O_2$ gas are supplied from a shower plate 402 to set the internal pressure of the processing chamber 401 at about 1 Torr. A silicon wafer substrate 403 (301 in FIG. 11) having a (110) plane on its surface is placed on a sample table 404 having a heating mechanism, and the temperature of the silicon wafer substrate 403 is set at about 400° C. When this temperature setting ranges from 200° C. to 550° C., the results to be described below are substantially the same.

Subsequently, a microwave at 2.45 GHz is supplied from a coaxial waveguide 405 into the processing chamber 401 via a radial line slot antenna 406 and dielectric plate 407, thereby generating a high-density plasma in the processing chamber 401. When the frequency of the supplied microwave ranges from 900 MHz to 10 GHz, the results to be described below are substantially the same. In this embodiment, the spacing between the shower plate 402 and substrate 403 is set to 6 cm. The narrower the spacing, the faster the film formation. Although film formation is performed using the plasma apparatus having the radial line slot antenna in this embodiment, a microwave may also be supplied into the processing chamber by using another method.

When the silicon surface is oxidized in the ambient containing radical oxygen, the probability of adhesion of the oxidation species to projecting portions on the silicon surface increases. In addition, when radicals collide against these projecting portions, the projecting portions are negatively charged and readily attract oxygen ions such as $O^+$ and $O_2^+$. When these effects are combined, the projecting portions preferentially oxidize, and this presumably forms a planarized silicon oxide film on the silicon surface.

Figure 12:
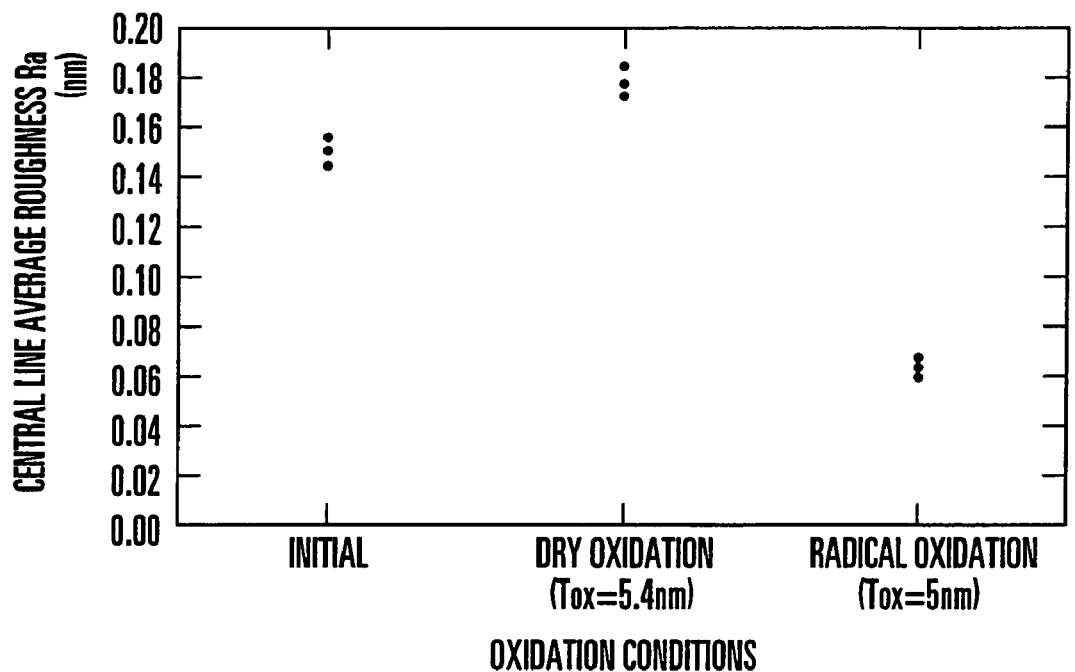
FIG. 12 is a graph which explains the effect of the fabrication method according to the fourth embodiment of the present invention, and shows the dependence of an oxidation method on planarization of the silicon surface.

FIG. 12 shows the way the surface flatness changes before and after oxidation when dry oxidation is performed on the silicon surface and when oxidation is performed in the ambient containing radical oxygen. Referring to FIG. 12, INITIAL indicates the central line average roughness Ra after the SC1 step at a low OH concentration described above is performed. As shown in FIG. 12, the central line average roughness Ra ranges between 0.14 and 0.16 nm.

When a silicon oxide film is formed on this silicon surface by dry oxidation, the central line average roughness Ra changes between 0.17 and 0.19 nm. On the other hand, when a silicon oxide film is formed by radical oxidation as in this embodiment, the central line average roughness Ra of the surface is smaller than 0.07 nm. That is, while dry oxidation increases the roughness, radical oxidation improves the flatness.

The roughness after oxidation shown in FIG. 12 was obtained after the oxide film was dipped in a solution mixture of HF and HCl (the volume ratio was HF:HCl=1.19) for one min and then peeled. Note that the solution mixture of HF and HCl was used in etching of the oxide film in order to suppress etching of the silicon surface when the oxide film was peeled by the use of a liquid chemical having as low an OH ion concentration as possible, thereby accurately checking the conditions of the interface between silicon and the gate insulation film.

Prior to measuring the roughness after oxidation, (110) silicon was dipped in a solution mixture of HF and HCl for 10 min or more, and changes in central line average roughness Ra before and after the dipping were checked. Consequently, no changes in central line average roughness Ra were found on the (110) silicon before and after the dipping, i.e., the silicon was not etched. In this manner, the propriety of this evaluation method was confirmed. In the following explanation, the roughness value of the silicon surface below the insulation film is a value evaluated after the insulation film was dipped in the solution mixture of HF and HCl for 1 min and then peeled.

As described above, radical oxidation can improve the flatness of the silicon surface. Planarizing of the silicon surface using this radical oxidation process is the technique applicable to any semiconductor elements regardless of the silicon plane orientation or the type of semiconductor element to which it is applied.

After the sacrificial oxide film 303 described above is formed, as shown in FIG. 11D, the sacrificial oxide film 303 is peeled. In this embodiment, the sacrificial oxide film 303 was peeled by using a liquid chemical mixed at a volume ratio of HF:HCl=1:19 and having a pH of 1 or less.

Then, as shown in FIG. 11E, the silicon surface in the element region is oxidized in an ambient containing radical oxygen to form a gate insulation film 304 made of a 5-nm thick silicon oxide film. In this state, the gate insulation film 304 was dipped in a liquid chemical mixed at a volume ratio of HF:HCl=1:19 and having a pH of 1 or less, and peeled as an experiment, thereby evaluating the roughness of the interface between the silicon surface and gate insulation film. As a consequence, the central line average roughness Ra was 0.06 nm.

Subsequently, boron is ion-implanted into the entire surface of the silicon wafer substrate 301 on which the gate insulation film 304 is formed, in order to control the threshold voltage (FIG. 1F). After this boron ion implantation, a polysilicon electrode (gate electrode) 305 is formed on the gate insulation film 304 in the element region 302 (FIG. 1G).

After the formation of the gate electrode 305, boron is ion-implanted at a low concentration to form P-source and P-drain regions 306 (FIG. 11H), and a sidewall insulation film 307 is formed on the side walls of the gate electrode 305 (FIG. 11I). After that, a P-type impurity such as boron is ion-implanted at a high concentration to form $P^+$-source and $P^+$-drain regions 308 (FIG. 11J). Finally, holes are formed in the insulation film 304 above the $P^+$-source and $P^+$-drain regions 308, and a source electrode and drain electrode (not shown) are formed by aluminum or the like, thereby completing the fabrication of the P-channel power MIS field effect transistor.

The relationship between the central line average roughness Ra and mobility after RCA cleaning shown in FIG. 11B was studied. That is, the central line average roughness Ra of the silicon surface was changed from 0.05 to 0.18 nm by changing the ammonia concentration during SC1 cleaning after RCA cleaning, and a change in roughness scattering component of the mobility was checked.

Figure 13:
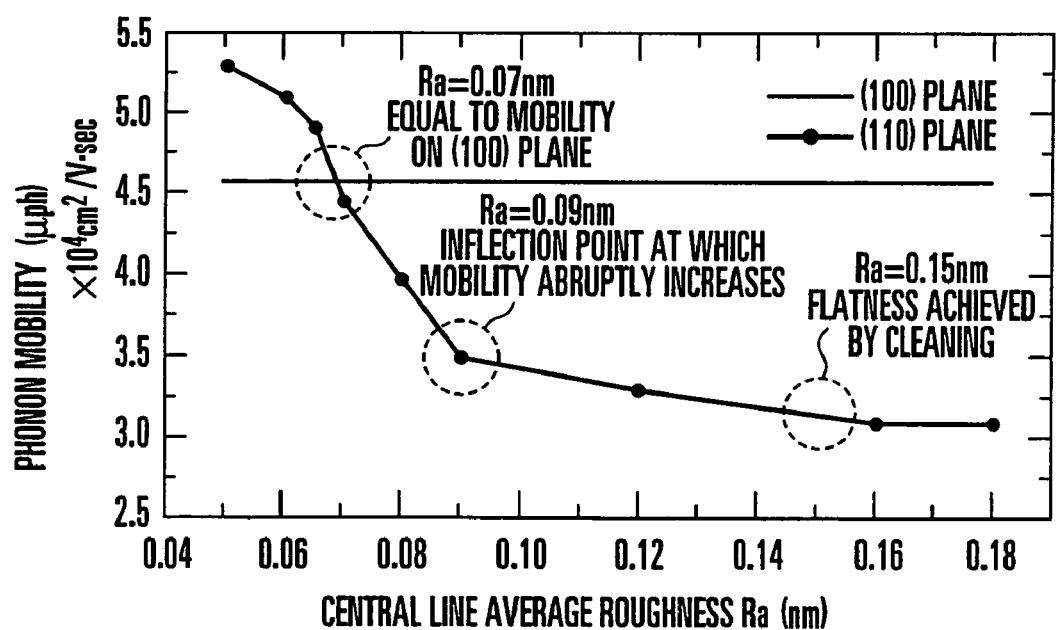
FIG. 13 is a graph for explaining the relationship between the central line average roughness of the silicon surface and the electron mobility.

The result is shown in FIG. 13. FIG. 13 shows that the mobility increases as the central line average roughness Ra decreases. When the low-OH-concentration SC1 step described above was used, the central line average roughness Ra was about 0.15 nm, so it can be said that this is the planarization limit achievable by cleaning. By contrast, when the sacrificial oxide film 303 was formed by radical oxidation and then peeled as in this embodiment, it was possible to planarize the central line average roughness Ra to 0.05 nm.

As is also apparent from the relationship between the central line average roughness Ra and mobility of (110) silicon shown in FIG. 13, the electron mobility improving phenomenon was observed when the central line average roughness Ra was 0.15 nm or less. Additionally, the mobility abruptly increased when the central line average roughness Ra was 0.09 nm or less. It can be said that 0.09 nm is the point of inflection at which the abrupt mobility rise starts. Furthermore, it is possible to predict that when the central line average roughness Ra is planarized to 0.07 nm, mobility equal to the carrier electron mobility obtained by the (100) surface is obtained, and the mobility improves until 0.05 nm or less.

The foregoing are the findings which can be obtained for the first time because a very flat surface is obtained by performing the radical sacrificial oxidation described above after cleaning.

In this embodiment, as also shown in FIG. 13, it was possible to achieve central line average roughness=0.05 nm, and make the mobility three times as high as that of a P-channel MIS transistor formed using the conventional RCA cleaning.

In this embodiment, therefore, current drivability equal to that of an N-channel power MIS field effect transistor can be obtained for the same size and the same cost.

It is also possible to improve the reliability of the gate insulation film 304 because the interface between the silicon surface and gate insulation film is planarized more than in a MIS transistor formed using the conventional RCA cleaning.

Note that the gate insulation film 304 is formed using the microwave-excited plasma in this embodiment, but it may also be formed by another fabrication method such as CVD. The silicon oxide film forming the gate insulation film 304 need only exist in at least a portion in contact with silicon, and one or more insulation films made of a different material such as an oxide, nitride, oxynitride, or silicate using, e.g., an alkaline earth metal, rare earth metal, or transition metal may also be stacked on the silicon oxide film. When the gate-to-source breakdown voltage is, e.g., 60 V, the thickness of a gate insulation film formable by the microwave-excited plasma is about a few ten nm. Therefore, it is also possible to form, on this gate insulation film, an insulation film by another fabrication method, e.g., CVD, thereby forming a gate insulation film 304 having a desired thickness.

In addition, instead of the silicon oxide film formed in this embodiment, a gate insulation film made of, e.g., an oxide, nitride, oxynitride, or silicate using an alkaline earth metal, rare earth metal, or transition metal may also be formed. Furthermore, a gate insulating film including at least one of a silicon oxide film, silicon nitride film, and silicon oxynitride film may also be formed.

Examples of materials forming a high-k film usable as the gate insulation film in this embodiment are a metal silicate of one or a combination of elements selected from Hf, Zr, Ta, Ti, La, Co, Y, and Al, a metal oxide of one or a combination of elements selected from Si, Hf, Zr, Ta, Ti, Y, Nb, Na, Co, Al, Zn, Pb, Mg, Bi, La, Ce, Pr, Sm, Eu, Gd, Dy, Er, Sr, and Ba, a metal nitride of one or a combination of elements selected from Si, Hf, Zr, Ta, Ti, Y, Nb, Na, Co, Al, Zn, Pb, Mg, Bi, La, Ce, Pr, Sm, Eu, Gd, Dy, Er, Sr, and Ba, and a metal oxynitride of one or a combination of elements selected from Si, Hf, Zr, Ta, Ti, Y, Nb, Na, Co, Al, Zn, Pb, Mg, Bi, La, Ce, Pr, Sm, Eu, Gd, Dy, Er, Sr, and Ba.

Fifth Embodiment

A method of fabricating a P-channel power MIS field effect transistor according to the fifth embodiment of the present invention will be described below with reference to FIG. 14. In the fourth embodiment, a (110) silicon plane having a surface on which Si is epitaxially grown is used. In this embodiment, a silicon plane obtained by off-orienting, by 8° in the <100> direction, a (110) silicon plane having a surface on which Si is epitaxially grown is used, and a gate silicon oxynitride film is also used. Note that the plane off-oriented by 8° is in other words a (551) silicon plane.

First, as shown in FIG. 14A, an N-type silicon wafer substrate 401 having a (551) plane on its surface is prepared, and element isolation is performed on the surface by STI or the like, thereby forming an element region 402 including source, drain, and channel regions.

Then, RCA cleaning is performed on the element region 402 (FIG. 14B). In this embodiment, as in the fourth embodiment, to suppress the increase in roughness during SC1 cleaning, a liquid chemical in which $NH_4OH:H_2O_2:H_2O=0.05:1:5$, i.e., which had an OH concentration lower than that in the conventional SC1 treatment was used.

After that, as shown in FIGS. 14C and 14D, as a process of planarizing the silicon surface of the element region 402, a sacrificial oxide film 403 is formed by oxidizing the surface of the element region 402 in an ambient containing radical oxygen at 300° C. to 500° C., and then peeled. In this embodiment, the sacrificial oxide film 403 was peeled by using a liquid chemical mixed at a volume ratio of HF:HCl=1:19 and having a pH of 1 or less.

Figure 15:
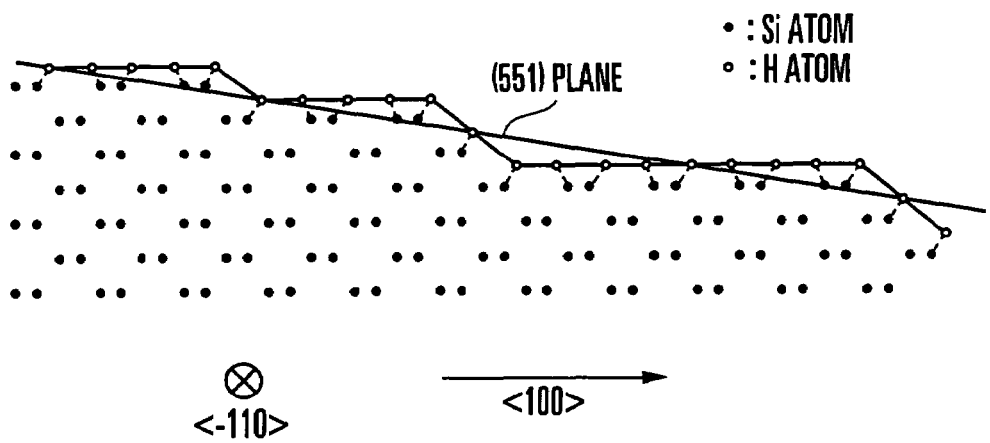
FIG. 15 is a schematic view showing atomic steps in a (551) plane used in the fifth embodiment of the present invention.

When the surface condition after the sacrificial oxide film 403 is peeled is observed, as shown in FIG. 15, a self-aligned staircase shape including terraces each having a (110) plane on its surface and steps along the <−110> direction appears. The step height is preferably about 0.17 to 0.35 nm, and the central line average roughness Ra is preferably about 0.04 nm.

Then, as shown in FIG. 14E, the silicon surface in the element region 402 is oxidized in an ambient containing radical oxygen to form a gate insulation film 404 made of a silicon oxynitride film. In this state, the gate insulation film 404 was dipped in a liquid chemical mixed at a volume ratio of HF:HCl=1:19 and having a pH of 1 or less, and peeled as an experiment, thereby evaluating the roughness of the interface between the silicon surface and gate insulation film. As a consequence, the central line average roughness Ra was 0.05 nm. For comparison, the central line average roughness Ra of the silicon surface on which no radical sacrificial oxidation was performed was checked, and found to be 0.15 nm.

As in the fourth embodiment, the gate silicon oxynitride film of the field effect transistor of this embodiment can be formed by using the microwave-excited plasma apparatus (FIG. 6) which uses the radial line slot antenna. More specifically, the silicon oxynitride film is formed as follows.

First, a vacuum vessel (processing chamber) 401 is evacuated, and Kr gas, $O_2$ gas, and $NH_3$ gas are supplied from a shower plate 402 to set the internal pressure of the processing chamber 401 at about 1 Torr. A silicon wafer substrate 403 (401 in FIG. 14) having a (110) plane on its surface is placed on a sample table 404 having a heating mechanism, and the temperature of the silicon wafer substrate 403 is set at about 400° C. When this temperature setting ranges from 200° C. to 550° C., the results to be described below are substantially the same.

Subsequently, a microwave at 5.45 GHz is supplied from a coaxial waveguide 405 into the processing chamber 401 via a radial line slot antenna 406 and dielectric plate 407, thereby generating a high-density plasma in the processing chamber 401. The spacing between the shower plate 402 and substrate 403 is set to about 6 cm. Although oxynitriding is performed using the plasma apparatus having the radial line slot antenna in this embodiment, a microwave may also be supplied into the processing chamber by using another method.

In the gate silicon oxynitride film formation of this embodiment, as in the second embodiment, the existence of hydrogen is an important factor. The existence of hydrogen eliminates the hysteresis of the CV characteristic, and decreases the surface density of the film interface between silicon and the silicon oxynitride film to $3 \times 10^{10}$ cm$^{-2}$. When a silicon oxynitride film is to be formed by using a gas mixture of a rare gas (Ar or Kr), $O_2$, $N_2$, and $H_2$, traps of electrons and holes in the film abruptly reduce by setting the partial pressure of the hydrogen gas at 0.5% or less.

After the gate insulation film 404 is formed, boron is ion-implanted into the entire surface of the silicon wafer substrate 401 in order to control the threshold voltage (FIG. 14F), and a polysilicon electrode (gate electrode) 405 is formed on the gate insulation film 404 in the element region 402 (FIG. 14G).

After the formation of the gate electrode 405, boron is ion-implanted at a low concentration to form P-source and P-drain regions 406 (FIG. 14H), and a sidewall insulation film 407 is formed on the side walls of the gate electrode 405 (FIG. 14I). After that, a P-type impurity such as boron is ion-implanted at a high concentration to form $P^+$-source and $P^+$-drain regions 408 (FIG. 14J). Finally, holes are formed in the insulation film 404 above the $P^+$-source and $P^+$-drain regions 408, and a source electrode and drain electrode (not shown) are formed by aluminum or the like, thereby completing the fabrication of the P-channel power MIS field effect transistor.

In this embodiment, it was possible to realize mobility three times as high as that of a P-channel MIS transistor formed using the conventional RCA cleaning.

In addition, the reliability of the gate insulation film can be improved because the interface between the silicon surface and gate insulation film is planarized more than that of a MIS transistor formed using the conventional RCA cleaning.

Note that in this embodiment, a gate silicon nitride film may also be formed by supplying, e.g., Kr gas and $NH_3$ gas into the microwave-excited plasma processing chamber.

Note also that the silicon oxynitride film or silicon nitride film forming the gate insulation film 404 need only exist in at least a portion in contact with silicon, and one or more insulation films made of a different material such as an oxide, nitride, oxynitride, or silicate using, e.g., an alkaline earth metal, rare earth metal, or transition metal may also be stacked on the gate insulating film 404. In this embodiment, the thickness of the gate insulation film is 40 nm because a P-channel power MIS field effect transistor having a gate-to-source breakdown voltage of 20 V is formed (because a power transistor for use in an automobile electronic part to be driven by a battery having a rated voltage of 12 V is formed), and the film can be formed by nitriding or oxynitriding. When the gate-to-source breakdown voltage is, e.g., 60 V, however, the thickness of a gate silicon oxide film formable by the microwave-excited plasma is about a few ten nm. Therefore, it is also possible to form, on this gate insulation film, an insulation film by another fabrication method, e.g., CVD, thereby forming a gate insulation film 404 having a desired thickness.

In addition, instead of the silicon oxynitride film formed in this embodiment, a gate insulation film made of, e.g., an oxide, nitride, oxynitride, or silicate using an alkaline earth metal, rare earth metal, or transition metal may also be formed.

In the fourth and fifth embodiments described above, the silicon surface is planarized by the radical sacrificial oxidation process. However, it is also possible to maintain or improve the flatness, and improve the performance of a P-channel power MIS field effect transistor, by using a method other than the radical sacrificial oxidation process.

Sixth Embodiment

First, an embodiment which improves the flatness by using wet oxidation will be explained below as the sixth embodiment. (110) silicon including a surface having a relatively large roughness is prepared, and the silicon surface is oxidized by wet oxidation at 1,000° C., $H_2$=1 slm, and $O_2$=1 slm, thereby forming a 3,000-Å thick silicon oxide film (the first step).

Then, the silicon oxide film was etched back with an $H_2O$ liquid chemical containing HF until the residual film thickness was 0 to 2,500 Å (the second step). After that, the first and second steps were repeated twice, and the silicon oxide film was finally completely peeled by using a liquid chemical mixed at a volume ratio of HF:HCl=1:19 and having a pH of 1 or less.

Figure 16:
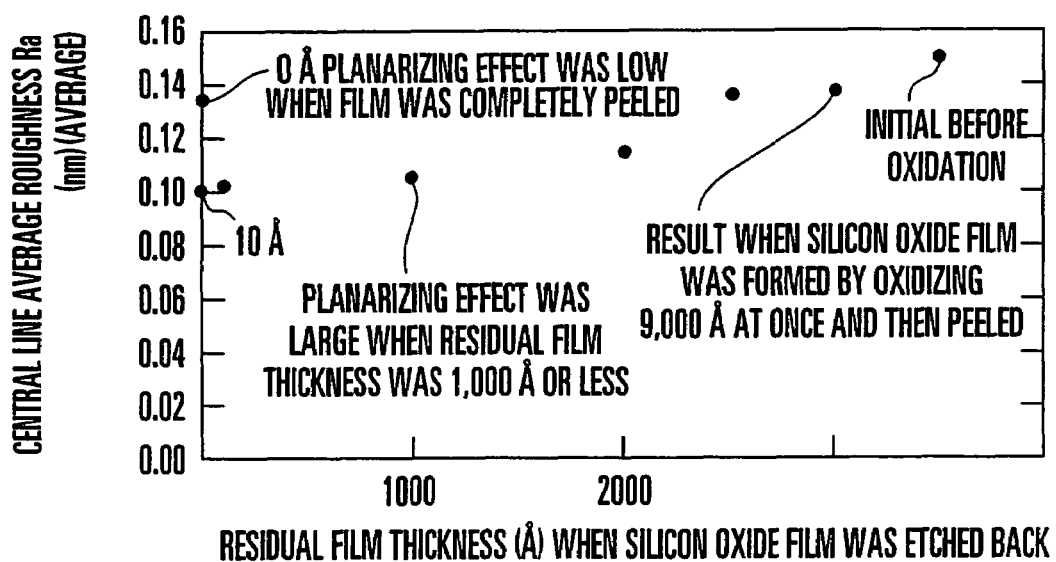
FIG. 16 is a graph showing the relationship between the etch-back residual film amount of a silicon oxide film and the central line average roughness in the second step of a fabrication method according to the sixth embodiment of the present invention.

The results are shown in FIG. 16. In FIG. 16, the abscissa indicates the residual film amount (thickness) of the silicon oxide film in the second step, and the ordinate indicates the central line average roughness Ra. As a reference, FIG. 16 also shows data obtained when a 9,000-Å thick silicon oxide film was formed at once and then peeled by using a liquid chemical mixed at a volume ratio of HF:HCl=1:19 and having a pH of 1 or less.

Referring to FIG. 16, the central line average roughness Ra decreases as the residual film thickness of the silicon oxide film during etching back in the second step decreases, and almost saturates when the residual film thickness is 1,000 Å. When the residual film thickness is 0, i.e., when the silicon oxide film is completely peeled off, the effect of planarization is lost.

This is probably because when the silicon surface is exposed by a liquid chemical treatment, factors such as attack and metal contamination which are caused on the silicon surface by the liquid chemical and interfere with planarization increase. When the residual film amount in the second step was set to an appropriate value, e.g., 100 Å, the planarization effect obtained by repeating the first and second steps was higher than that obtained by forming a 9,000-Å thick silicon oxide film at once and then peeling it.

The mechanism of the planarization effect obtained by oxidation and etch back is unknown. However, one possible cause is that when the residual film is thinned by etch back, the oxidation species of wet oxidation easily evenly reaches the vicinity of the interface between silicon and the silicon oxide film.

Figure 17:
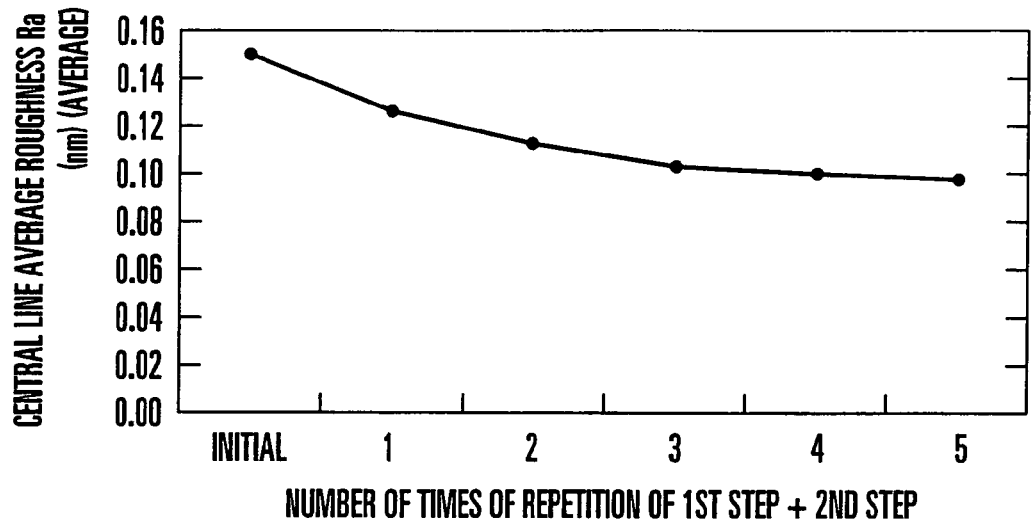
FIG. 17 is a graph showing the relationship between the number of times of repetition of the first and second steps performed in the sixth embodiment of the present invention and the central line average roughness.

Furthermore, the relationship between the number of times of repetition of the first and second steps and the flatness was checked. The result is shown in FIG. 17. In FIG. 17, the abscissa indicates the number of times of repetition, and the ordinate indicates the central line average roughness Ra. As is apparent from FIG. 17, when the number of times of repetition exceeded 3, the central line average roughness Ra almost saturated. This demonstrates that the number of times of repetition of the first and second steps has an appropriate value.

As described above, the silicon surface can be planarized more than the initial wafer by performing oxidation using a wet gas (the first step), etching back the oxide film without peeling it until the film thickness is 10 to 1,000 Å (the second step), repeating the first and second steps a desired number of times, and finally peeling the oxide film by an aqueous solution containing HF.

Seventh Embodiment

A method of maintaining and improving the flatness without using any liquid chemical treatment will be described below as the seventh embodiment of the present invention. As described above, RCA cleaning is often used to clean the silicon surface. During SC1 cleaning (cleaning performed by dipping silicon into ammonia, aqueous hydrogen peroxide, and pure water heated to about 80° C.) in the RCA cleaning step, weak portions of Si—Si bonds are attacked by OH ions, and this roughens the Si surface. In the SC1 treatment, oxidation of the silicon surface by aqueous hydrogen peroxide, Si—O etching by OH ions, and etch back by Si—Si etching progress at the same time. Although this gives the RCA cleaning the characteristic that the effect of removing particles and organic contamination is high, the RCA cleaning has the side effect, i.e., the roughness on the Si surface. To keep the silicon surface not roughened as much as possible, a cleaning method using no alkali cleaning is required. As a cleaning method which uses no alkali cleaning and has the capability of removing particles, organic contamination, and metal contamination on a level equal to or higher than that of RCA, Japanese Patent Laid-Open No. 11-057636 discloses a cleaning method using five steps.

This cleaning method disclosed in Japanese Patent Laid-Open No. 11-057636 is characterized by comprising the first step of performing cleaning by using pure water containing ozone, the second step of performing cleaning by using a cleaning solution containing HF, $H_2O$, and a surfactant while applying a vibration at a frequency of 500 kHz or more, the third step of performing cleaning by using pure water containing ozone, the fourth step of performing cleaning by using a cleaning solution containing HF and $H_2O$ to remove a silicon oxide film, and the fifth step of performing cleaning by using pure water.

The cleaning method disclosed in Japanese Patent Laid-Open No. 11-057636 is presumably capable of performing cleaning without deteriorating the flatness of the Si surface, because no alkali treatment is included as described above. Japanese Patent Laid-Open No. 11-057636 shows an example in which the central line average roughness Ra of the surface is maintained at 0.11 nm before or after cleaning. However, Japanese Patent Laid-Open No. 11-057636 does not point out the fact that the surface roughness (Ra) increases when RCA cleaning is performed. In addition, Japanese Patent Laid-Open No. 11-057636 describes the results of experiments limitedly conducted on silicon having a (100) plane on its surface. For silicon having a (110) plane on its surface, no initial wafer of 0.15 nm or less can be obtained, and a central line average roughness Ra of 0.15 nm or less cannot be obtained even when this method is used.

The present inventors have found that the surface flatness can be maintained by decreasing the dissolved oxygen amount by deaerating $H_2O$ used in the second and fourth steps of the first to fifth steps disclosed in Japanese Patent Laid-Open No. 11-057636. That is, in the second step of this embodiment, particles are removed by removing the silicon oxide film formed in the first step. Likewise, in the fourth step, metal contamination is removed by removing the silicon oxide film formed in the third step.

If dissolved oxygen exists in the liquid chemicals in the second and fourth steps, on the silicon surface on which removal is done by HF, weak portions of Si—Si bonds are selectively oxidized again and removed by HF at the same time. As a consequence, the surface roughness increases. In this embodiment, therefore, it is found that the surface roughness (Ra) can be maintained by performing liquid chemical treatments by decreasing the dissolved oxygen amount in the second and fourth steps from the conventional ppm order to 100 ppb or less (preferably, 10 ppb or less).

More specifically, cleaning using pure water containing 5 ppm of ozone was performed on silicon having a (110) plane on its surface for 5 min (the first step), and cleaning using a cleaning solution containing a deaerated aqueous 0.5% HF solution, deaerated $H_2O$, and 50 ppm of a surfactant was performed for 5 min while a vibration at a frequency of 950 kHz was applied (the second step). Then, cleaning using pure water containing 5 ppm of ozone was performed for 5 min (the third step), cleaning using a cleaning solution containing deaerated 0.5% HF and deaerated $H_2O$ was performed for 1 min to remove an oxide film (the fourth step), and cleaning using ultrapure water prepared by adding 0.1 to 50 ppm of H to deaerated $H_2O$ was performed for 10 min (the fifth step).

Figure 18:
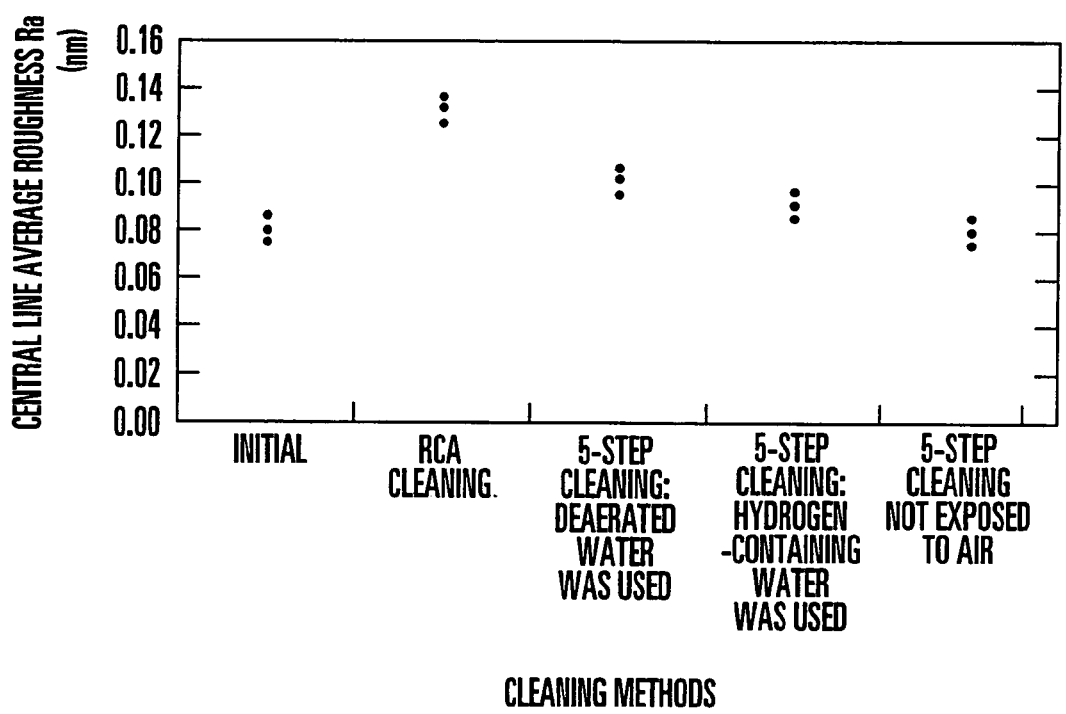
FIG. 18 is a graph showing the effect of a surface flatness maintenance method according to the seventh embodiment of the present invention.

Also, the cleaning was performed by dipping silicon into a cleaning solution. FIG. 18 shows the results obtained by comparing the roughness of the silicon surface having undergone the cleaning with that of the conventional RCA. As shown in FIG. 18, the central line average roughness Ra which was 0.08 nm before the cleaning increased to 0.13 nm when RCA cleaning by the conventional technique was performed on the silicon surface, but the increase in roughness decreased to 0.10 nm in this embodiment.

Note that the technique capable of reducing the roughness of the silicon surface by using a cleaning solution containing HF and $H_2O$ having a dissolved oxygen concentration of 100 ppb or less when a silicon oxide film is to be peeled as in this embodiment may also be used when one of a silicon nitride film and silicon oxynitride film is to be peeled.

In addition, it was attempted to decrease the OH ion concentration, in addition to the effect of decreasing the dissolved oxygen amount, by deaerating $H_2O$ used in the second and fourth steps, and then adding 0.1 to 50 ppm of hydrogen. FIG.

18 shows the results compared with RCA. Consequently, the central line average roughness Ra increased by about 0.01 nm from 0.08 nm of the initial wafer, but this increase was smaller than that of RCA. Especially in the second step, the cleaning method disclosed in Japanese Patent Laid-Open No. 11-057636 has the problem that if the processing is performed while a vibration at a frequency of 500 kHz or more is applied, $H_2O$ dissociates into H and OH, and this increases the OH concentration.

In this embodiment, the central line average roughness Ra can be substantially maintained by performing cleaning by using a cleaning solution containing HF, $H_2O$ which is deaerated to have 100 ppb or less of dissolved oxygen and to which 50 ppm of H are added after that, and 50 ppm of a surfactant. This means that ultrasonic cleaning which suppresses the generation of OH is performed in the second step. Note that the amount of dissolved oxygen is favorably 10 ppb or less.

Furthermore, in addition to the use of the liquid chemical prepared by deaerating $H_2O$ and then adding 0.1 to 50 ppm of hydrogen in the second and fourth steps, the five steps were performed in an apparatus in which neither the cleaning liquid chemical nor the silicon surface was exposed to the air from the start to the end of the cleaning, thereby preventing oxygen from dissolving into the liquid chemical from the air. FIG. 18 shows the results compared with the conventional RCA. As shown in FIG. 18, the roughness does not increase from 0.08 nm of the initial wafer, i.e., the surface roughness (Ra) can be maintained.

The treatment or cleaning of a semiconductor described above may also be performed by using only a non-alkaline solution having a pH of 7 or less. In this case, it is also possible to perform ultrasonic cleaning while the generation of OH is suppressed, or to suppress the generation of OH by addition of $H_2$.

Eighth Embodiment

Figure 19A:
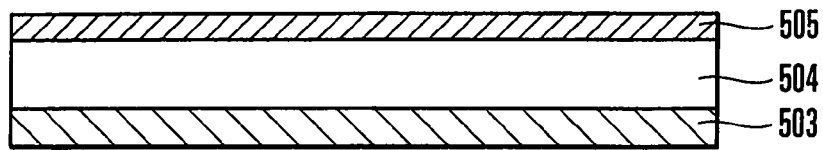
FIGS. 19A to 19D are sectional views showing the steps of a fabrication method according to the eighth embodiment of the present invention.

An embodiment in which the present invention is applied to a trench-structure vertical P-channel power MOS transistor will be explained below. FIG. 19A shows a vertical P-channel MOSFET substrate in this embodiment, which is obtained by forming, on a silicon substrate (not shown) having a (110) plane, a heavily doped drain layer 503 having a first conductivity type, a drain layer 504 different in impurity concentration from but the same in conductivity type as the heavily doped drain layer 503, and a body layer 505 which has a second conductivity type opposite to the first conductivity type and in which the channel of a P-channel MOSFET is to be formed. The conductivity type, impurity concentration, and thickness of the heavily doped drain layer are p-type $1 \times 10^{20}$ cm$^{-3}$ and 0.2 µm, those of the drain layer are p-type $2 \times 10^{17}$ cm$^{-3}$ and 0.5 µm, and those of the body layer are n-type $5 \times 10^{18}$ cm$^{-3}$ and 0.2 µm. In this embodiment, the heavily doped drain layer 503 has an impurity concentration of about $1 \times 10^{20}$ cm$^{-3}$ or more and a thickness of 20 µm or less, so it is possible to reduce the series resistance of the formed element, and easily form an element which operates at a high speed. In addition, since the layer 503 is made of Si single crystal having a (110) plane orientation, the diffusion constant can be made larger than that when the conventional (100) substrate is used, and this increases the operating speed. Also, this Si layer is formed by low-temperature epitaxial growth at about 600° C. or less, and the impurity profile is precisely controlled, so a high-performance element can be easily fabricated.

Figure 19B:
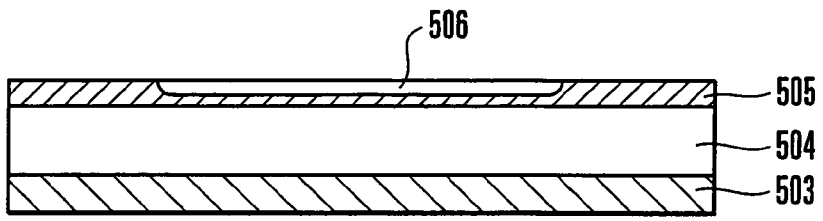
Figure 19C:
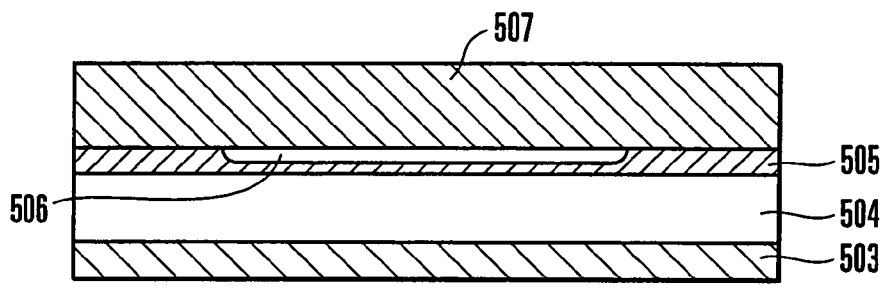

In the vertical trench-structure P-channel MOSFET according to this embodiment, the substrate shown in FIG. 19A is used, and, to form a source region, as shown in FIG. 19B, $BF_2^+$ is ion-implanted in order to dope boron for forming the conductivity type opposite to that of the body region 505, thereby forming a source region 506. The impurity concentration is p-type $1 \times 10^{20}$ cm$^{-3}$. Subsequently, to form an interlayer dielectric film, 0.5-µm thick $SiO_2$ 507 is deposited by CVD (FIG. 19C). This makes it possible to reduce the overlap capacitance of a gate electrode and gate region.

Figure 19D:
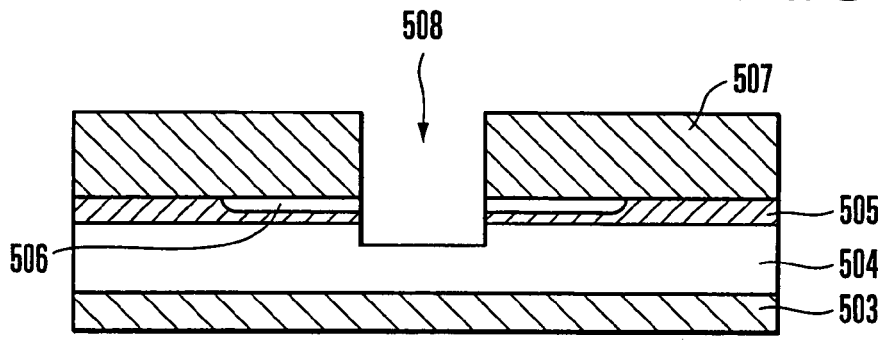
Figure 20A:
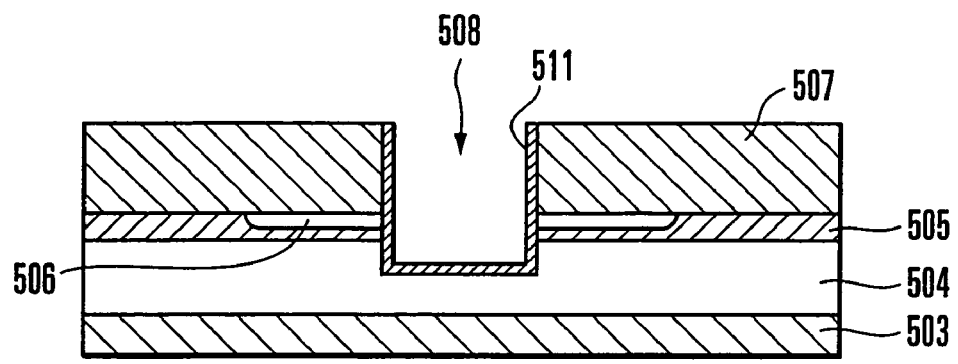
FIGS. 20A and 20B are sectional views showing the steps of the fabrication method according to the eighth embodiment of the present invention.

Then, as shown in FIG. 19D, to form a gate electrode, a trench hole 508 is formed in a prospective gate electrode region. This is done as follows. The entire substrate surface is coated with a photoresist, and the photoresist is patterned to form a hole in a trench formation portion of the resist. This hole is positioned in the source region. A trench hole is then formed by the generally used RIE method. The bottom portion of the trench hole 508 reaches the drain region 504, and the depth, width, and length are 0.8, 0.3, and 20 µm, respectively, in this embodiment. These values can be changed in accordance with the application of the element. Since the surface of the silicon 505 is a (110) plane, the inner wall surface of the trench hole 508 which makes 90° with the silicon surface is also a (110) plane. Then, as shown in FIG. 20A, a gate oxide film 511 is formed after the photoresist is removed. The gate oxide film formation is done by oxidizing a gas mixture of Kr and $O_2$ by using a plasma at a temperature of 400° C., thereby forming a 20-nm thick silicon oxide film on the inner walls of the trench hole. In this manner, a high-quality oxide film 511 having a breakdown voltage of 4 to 5 MV/cm can be evenly formed on the (110) inner walls of the trench hole 508. The gate-to-source breakdown voltage of the P-channel MOS transistor having the gate oxide film 511 is 10 V.

Figure 20B:
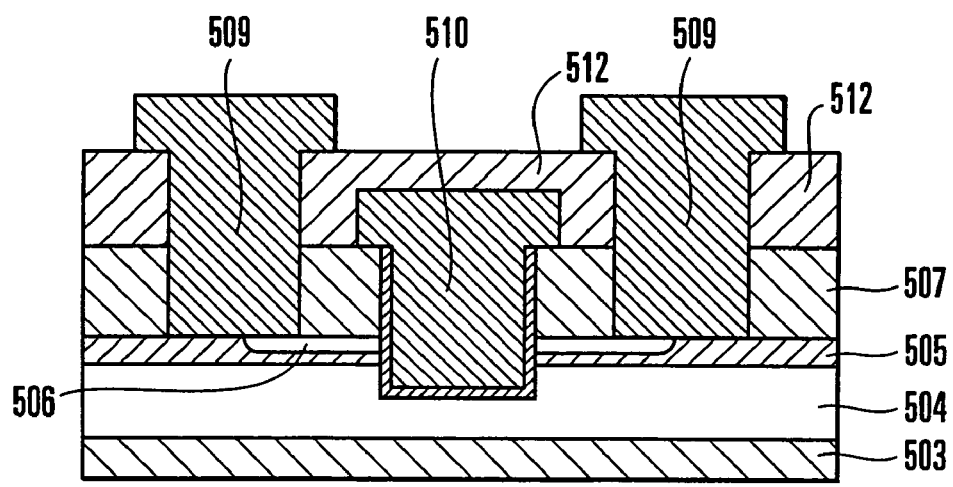

Then, as shown in FIG. 20B, a gate electrode 510 is formed. A gate electrode material, e.g., poly-Si is deposited by 0.1 µm at 400° C. by CVD, and an Al film containing about 1% of Si as an atomic composition is formed by sputtering. The entire substrate surface is coated with a photoresist, and a gate electrode portion is patterned to complete the gate electrode 510.

Subsequently, as shown in FIG. 20B, to form an interlayer dielectric film 512, $SiO_2$ is deposited on the entire substrate surface at 400° C. by CVD, thereby forming source electrodes 509. In this source electrode formation, a photoresist is applied first, and then holes for source electrode portions 509 are patterned. The source electrode holes are so patterned that photoresist holes are formed over both the p$^+$-type source layer 506 and n-type body layer 505. In this way, both the source electric potential and body electric potential can be obtained by the source electrode 509. To form holes, contact holes are formed by etching the $SiO_2$ films 507 and 512 in photoresist hole portions, and an Al film containing about 1% of Si as an atomic composition is formed by sputtering and patterned by etching, thereby forming the source electrodes 509.

By the steps described above, the trench-structure vertical P-channel power MOS field effect transistor according to this embodiment is completed. Since the heavily doped drain layer 503 was made as thin as 0.2 µm and its resistance was also well decreased, the series resistance of the element was low, so a high-speed transistor was obtained.

Note that equal effects can also be obtained by a drain-shorted element in which n$^+$-type silicon and p$^+$-type silicon are alternately arranged in a heavily doped drain region.

INDUSTRIAL APPLICABILITY

The present invention is applicable to a P-channel power MIS field effect transistor for use in, e.g., an automobile electronic part.

All publications, patents, and patent documents are incorporated by reference herein, as though individually incorporated by reference. The invention has been described with reference to various specific and preferred embodiments and techniques. However, it should be understood that many variations and modifications may be made while remaining within the spirit and scope of the invention.

The invention claimed is:

1. A P-channel power MIS field effect transistor which comprises a substrate comprising a silicon region whose surface is substantially a (110) plane,
a gate insulation film having a thickness of 20 nm or more formed on the (110) plane of the surface, and
a gate electrode formed on said gate insulation film and electrically connected to a gate control line, and in which said silicon region is used at least as a channel, wherein at least a contact portion of said gate insulation film, which is in contact with the surface of said silicon region, contains argon, krypton, or xenon, and a source-to-gate breakdown voltage of the P-channel MIS field effect transistor is not less than 10 V.

2. A P-channel power MIS field effect transistor according to claim 1, wherein a content of argon, krypton, or xenon in at least the contact portion of said gate insulation film, which is in contact with the surface of said silicon region, is not more than $5 \times 10^{11}$ cm$^{-2}$ as a surface density.

3. The P-channel power MIS field effect transistor according to claim 1, wherein a said gate insulation film has a thickness of 40 nm or more and the source-to-gate breakdown voltage of the P-channel MIS field effect transistor is 20 V or more.

4. A P-channel power MIS field effect transistor according to claim 1, wherein at least the contact portion of said gate insulation film, which is in contact with the surface of said silicon region, is made of a silicon oxide film, silicon oxynitride film, or silicon nitride film.

5. A P-channel power MIS field effect transistor according to claim 4, wherein at least the contact portion of said gate insulation film, which is in contact with the surface of said silicon region, is made of a silicon oxide film formed by oxidizing the surface of said silicon region by using radical oxygen, and having a thickness of not more than 100 nm.

6. A P-channel power MIS field effect transistor according to claim 4, wherein at least the contact portion of said gate insulation film, which is in contact with the surface of said silicon region, is made of a silicon nitride film formed by nitriding the surface of said silicon region by using radical nitrogen or radical NH, and having a thickness of not more than 100 nm.

7. A P-channel power MIS field effect transistor according to claim 4, wherein at least the contact portion of said gate insulation film, which is in contact with the surface of said silicon region, is made of a silicon oxynitride film formed by oxynitriding the surface of said silicon region by using radical nitrogen or radical NH and radical oxygen, and having a thickness of not more than 100 nm.

8. A P-channel power MIS field effect transistor according to claim 4, wherein a portion of said gate insulation film except for the contact portion in contact with the surface of said silicon region contains at least one of a silicon oxide film, silicon oxynitride film, and silicon nitride film formed by CVD.

9. A P-channel power MIS field effect transistor according to claim 1, wherein said gate insulation film is formed by using a gas mixture plasma containing a rare gas for generating microwave excitation and an insulation film formation gas.

10. A P-channel power MIS field effect transistor according to claim 9, wherein the rare gas is at least one of argon, krypton, and xenon, and the insulation film formation gas contains at least one of oxygen, nitrogen, and ammonia.

11. A P-channel power MIS field effect transistor according to claim 1, wherein the silicon surface having substantially a (110) plane is one of a (110) plane, (551) plane, (311) plane, (221) plane, (553) plane, (335) plane, (112) plane, (113) plane, (115) plane, (117) plane, (331) plane, (221) plane, (332) plane, (111) plane, and (320) plane.

12. A P-channel power MIS field effect transistor according to claim 1, wherein the silicon surface having substantially a (110) plane is a (110) plane or (551) plane.

13. A P-channel power MIS field effect transistor according to claim 1, wherein a thickness of said gate insulation film is 200 to 1,500 Å.

14. A P-channel power MIS field effect transistor which comprises a substrate having a silicon region whose surface is substantially a (110) plane, a gate insulation film formed on the surface, and a gate electrode formed on said gate insulation film, and in which said silicon region is used at least as a channel, wherein at least a contact portion of said gate insulation film, which is in contact with the surface of said silicon region, contains argon, krypton, or xenon, and a source-to-gate breakdown voltage of the P-channel MIS field effect transistor is not less than 10 V, wherein a gate threshold voltage of the P-channel power MIS field effect transistor is substantially equal to a gate threshold voltage of a P-channel MIS field effect transistor which has a gate insulation film not containing any of argon, krypton, and xenon, and in which said gate insulation film and a gate electrode are formed in a silicon region whose surface is a (100) plane.

15. A switching circuit wherein a power supply is directly or indirectly connected to one of a source and drain of a P-channel power MIS field effect transistor a load is connected to the other of the source and drain, and means for applying a driving signal for turning on or off the P-channel power MIS field effect transistor is connected to a gate, and wherein the P-channel power MIS field effect transistor comprises:
a substrate having a silicon region whose surface is substantially a (110) plane, a gate insulation film formed on the surface, and a gate electrode formed on said gate insulation film and electrically connected to a gate control line, and in which said silicon region is used at least as a channel, wherein at least a contact portion of said gate insulation film, which is in contact with the surface of said silicon region, contains argon, krypton, or xenon, and a source-to-gate breakdown voltage of the P-channel MIS field effect transistor is not less than 10 V.

16. A switching circuit according to claim 15, wherein a rated voltage of said power supply is not less than 12 V.

17. A switching circuit according to claim 15, wherein said means for applying the driving signal comprises a bipolar transistor.

* * * * *